US011751480B2

(12) United States Patent
Iwabuchi et al.

(10) Patent No.: US 11,751,480 B2
(45) Date of Patent: Sep. 5, 2023

(54) ELECTRONIC DEVICE

(71) Applicant: TAIYO YUDEN CO., LTD., Tokyo (JP)

(72) Inventors: Ryouta Iwabuchi, Tokyo (JP); Motoi Yamauchi, Tokyo (JP); Takashi Miyagawa, Tokyo (JP); Tsutomu Kikuchi, Tokyo (JP); Yuki Maruya, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 189 days.

(21) Appl. No.: 17/018,903

(22) Filed: Sep. 11, 2020

(65) Prior Publication Data

US 2021/0098683 A1 Apr. 1, 2021

(30) Foreign Application Priority Data

Sep. 26, 2019 (JP) .................................. 2019-175663

(51) Int. Cl.
*H10N 30/00* (2023.01)
*H10N 30/88* (2023.01)
*H03H 9/10* (2006.01)

(52) U.S. Cl.
CPC ........ *H10N 30/883* (2023.02); *H03H 9/1071* (2013.01); *H10N 30/00* (2023.02)

(58) Field of Classification Search
CPC ... H01L 41/08; H01L 41/0533; H03H 9/1071; H10N 30/88
See application file for complete search history.

(56) References Cited

U.S. PATENT DOCUMENTS

| | | | |
|---|---|---|---|
| 2010/0038992 A1* | 2/2010 | Moriya | H03H 9/02574 29/25.35 |
| 2012/0181898 A1* | 7/2012 | Hatakeyama | H03H 3/08 310/313 B |
| 2013/0062995 A1 | 3/2013 | Matsuda et al. | 310/313 R |
| 2014/0003196 A1* | 1/2014 | Tajima | H03H 9/1092 367/140 |
| 2014/0118093 A1 | 5/2014 | Yamashita | 333/187 |
| 2014/0210310 A1 | 7/2014 | Kuroyanagi | 310/313 R |

(Continued)

FOREIGN PATENT DOCUMENTS

| | | |
|---|---|---|
| JP | 2013-058911 A | 3/2013 |
| JP | 2014-090340 A | 5/2014 |

(Continued)

OTHER PUBLICATIONS

Notice of Reasons for Refusal dated Jul. 11, 2023 in a counterpart Japanese Patent Application No. 2019-175663.

*Primary Examiner* — J. San Martin
(74) *Attorney, Agent, or Firm* — Stein IP, LLC

(57) ABSTRACT

An electronic device includes a support substrate, a piezoelectric layer that is provided on the support substrate, a functional element including an electrode provided on a surface of the piezoelectric layer, a metallic frame body that is provided on the support substrate so as to surround the piezoelectric layer and the functional element in a plan view, a metallic lid that is provided on the frame body so as to form a space between the lid and the support substrate, and seals the functional element into the space, and a columnar body that is provided between the support substrate and the lid in the space.

11 Claims, 24 Drawing Sheets

(56) References Cited

U.S. PATENT DOCUMENTS

| | | | |
|---|---|---|---|
| 2015/0188507 A1 | 7/2015 | Shimizu | |
| 2017/0250669 A1* | 8/2017 | Kuroyanagi | H03H 9/0547 |
| 2017/0272051 A1* | 9/2017 | Kurihara | H03H 9/6483 |
| 2018/0159504 A1* | 6/2018 | Oda | H03H 9/1064 |
| 2019/0356299 A1* | 11/2019 | Kawasaki | H03H 9/145 |
| 2020/0186121 A1* | 6/2020 | Kawasaki | H03H 9/1071 |
| 2022/0140224 A1* | 5/2022 | Hamasaki | H01L 41/0475 |
| | | | 310/366 |
| 2022/0158614 A1* | 5/2022 | Tezuka | H03H 9/1071 |

FOREIGN PATENT DOCUMENTS

| | | |
|---|---|---|
| JP | 2014-143640 A | 8/2014 |
| JP | 2015-115671 A | 6/2015 |
| JP | 2015-126381 A | 7/2015 |
| JP | 2015-156626 A | 8/2015 |
| JP | 2016-201780 A | 12/2016 |
| JP | 2019-021998 A | 2/2019 |
| WO | WO 2009/090895 A1 | 7/2009 |

\* cited by examiner

FIG. 22A
FIG. 22B
FIG. 22C
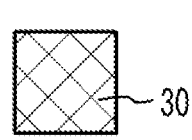
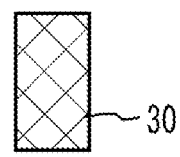
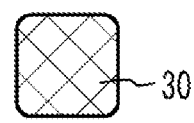
FIG. 22D
FIG. 22E
FIG. 22F
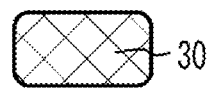
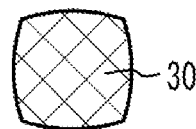
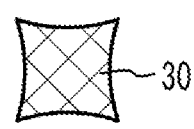
FIG. 22G
FIG. 22H
FIG. 22I
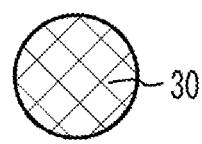
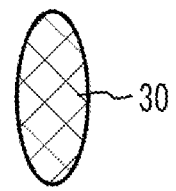
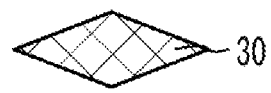
FIG. 22J
FIG. 22K
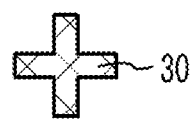
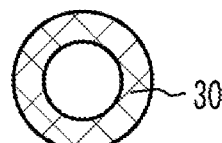

ELECTRONIC DEVICE

CROSS-REFERENCE TO RELATED APPLICATION

This application is based upon and claims the benefit of priority of the prior Japanese Patent Application No. 2019-175663, filed on Sep. 26, 2019, the entire contents of which are incorporated herein by reference.

FIELD

A certain aspect of the present invention relates to an electronic device.

BACKGROUND

There has been known an electronic device in which a lid is provided so as to form a space between the lid and a functional element such as an acoustic wave element provided on a substrate, and the functional element is sealed into the space (for example, Japanese Patent Application Publication Nos. 2013-58911, 2014-90340, 2014-143640, 2016-201780, and International Publication Pamphlet No. 2009/090895).

SUMMARY OF THE INVENTION

In the structure in which a metallic lid is provided over the space, the lid may deflect when a pressure is applied to the lid. The deflection of the lid causes the lid to be in contact with the functional element or the like, which may result in deterioration of the characteristics.

The present disclosure has a purpose of providing an electronic device that is capable of reducing the deflection of the lid.

According to an aspect of the present invention, there is provided an electronic device including: a support substrate; a piezoelectric layer that is provided on the support substrate; a functional element including an electrode provided on a surface of the piezoelectric layer; a metallic frame body that is provided on the support substrate so as to surround the piezoelectric layer and the functional element in a plan view; a metallic lid that is provided on the frame body so as to form a space between the lid and the support substrate, and seals the functional element into the space; and a columnar body that is provided between the support substrate and the lid in the space.

BRIEF DESCRIPTION OF THE DRAWINGS

FIGS. 22A to 22K are plan views illustrating examples of the shape of a columnar body;

DETAILED DESCRIPTION

Hereinafter, embodiments of the present disclosure will be described with reference to the drawings by using an acoustic wave device as an example of an electronic device.

First Embodiment

Figure 1A:
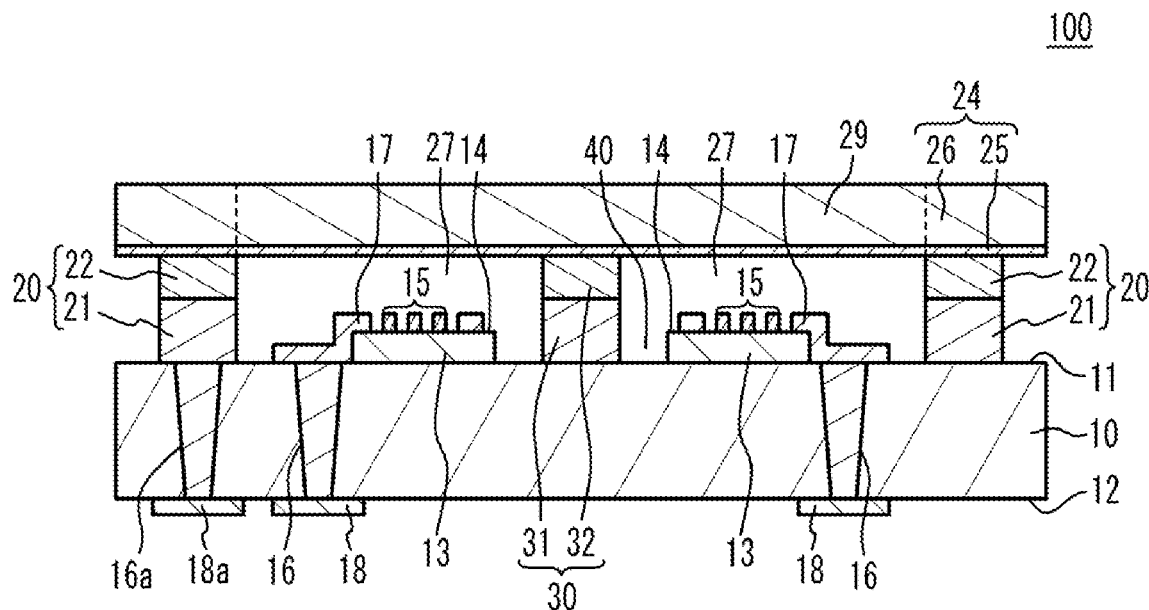
FIG. 1A is a cross-sectional view of an acoustic wave device according to a first embodiment.
Figure 1B:
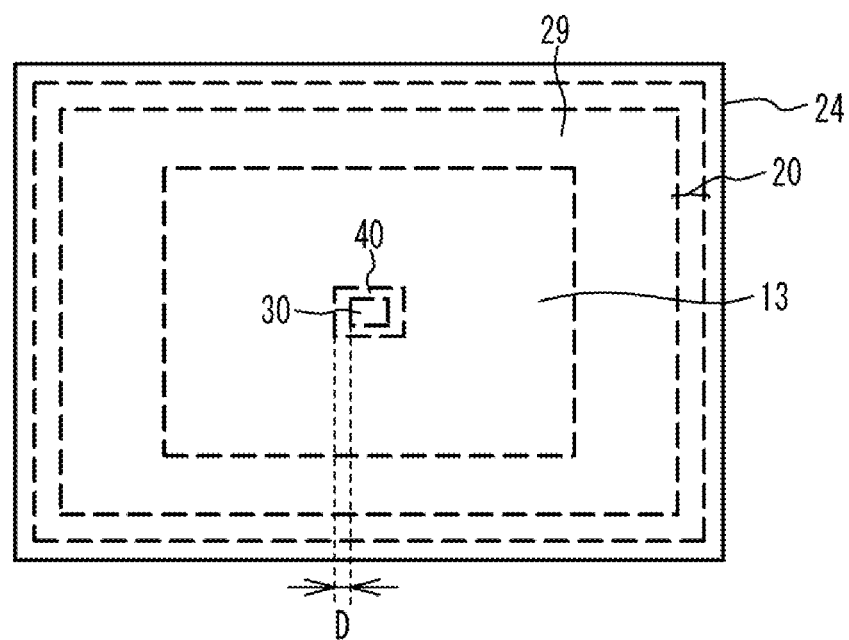
FIG. 1B is a plan view of the acoustic wave device according to the first embodiment.

FIG. 1A is a cross-sectional view of an acoustic wave device according to a first embodiment, and FIG. 1B is a plan view of the acoustic wave device according to the first embodiment. FIG. 1B mainly denotes a lid 24, a frame body 20, a piezoelectric layer 13 and a columnar body 30. In an acoustic wave device 100 of the first embodiment, the piezoelectric layer 13 is bonded on an upper surface 11 of a support substrate 10, as illustrated in FIGS. 1A and 1B. The support substrate 10 is a sapphire substrate, an alumina substrate, a spinel substrate, a quartz substrate, a crystal substrate, or a silicon substrate, for example. The sapphire substrate is a substrate including single crystal $Al_2O_3$ as a main component. The alumina substrate is a substrate including polycrystalline $Al_2O_3$ as the main component. The spinel substrate is a substrate including single crystal or polycrystalline $MgAl_2O_4$ as the main component. The quartz substrate is a substrate including amorphous $SiO_2$ as the main component. The crystal substrate is a substrate including single crystal $SiO_2$ as the main component. The piezoelectric layer 13 is, for example, a single crystal lithium tantalate layer or a single crystal lithium niobate layer. A linear expansion coefficient of the support substrate 10 is smaller than that of the piezoelectric layer 13. This makes is possible to reduce a frequency temperature coefficient of the acoustic wave device 100. An insulating layer such as silicon oxide or aluminum nitride may be provided between the piezoelectric layer 13 and the support substrate 10. Thus, the piezoelectric layer 13 is directly or indirectly bonded to the support substrate 10.

One or more acoustic wave elements 15 are provided on an upper surface 14 of the piezoelectric layer 13. The piezoelectric layer 13 is not provided in a peripheral region of the support substrate 10. In a plan view, the frame body 20 is provided on the support substrate 10 so as to surround the piezoelectric layer 13 and the acoustic wave elements 15. The frame body 20 is provided on the support substrate 10 and away from the piezoelectric layer 13. The frame body 20 includes an annular metal layer 21 and an annular bonding layer 22. The annular metal layer 21 is in contact with the upper surface 11 of the support substrate 10. The annular bonding layer 22 is provided on the annular metal layer 21.

A terminal 18 is provided on a lower surface 12 of the support substrate 10. The terminal 18 is a footpad for electrically connecting the acoustic wave element 15 to the outside. A via wiring 16 is provided so as to pass through the support substrate 10. One end of the via wiring 16 is connected to the terminal 18. The other end of the via wiring 16 is connected to a wiring 17 extending from the upper surface 14 of the piezoelectric layer 13 to the upper surface 11 of the support substrate 10. Thereby, the acoustic wave element 15 is electrically connected to the terminal 18 via the wiring 17 and the via wiring 16. A via wiring 16a is provided so as to pass through the support substrate 10. The via wiring 16a electrically connects a terminal 18a and the frame body 20.

The lid 24 is provided on the frame body 20 so as to form a space 27 between the lid 24 and the support substrate 10. The lid 24 is bonded to the frame body 20. The acoustic wave element 15 is sealed into the space 27 by the lid 24 and the frame body 20. The lid 24 includes a bonding layer 25 and a main body 26. The bonding layer 25 is bonded to the annular bonding layer 22. The main body 26 is thicker than the bonding layer 25, and is made of a material harder than the bonding layer 25 so that the lid 24 is less likely to be crushed.

The wiring 17, the via wirings 16 and 16a, the terminals 18 and 18a, and the annular metal layer 21 are metal layers such as a copper layer, an aluminum layer, a platinum layer, a nickel layer, or a gold layer. The annular bonding layer 22 is a brazing material metal layer such as gold tin, silver tin, tin, or tin-silver-copper. The bonding layer 25 is a metal layer bonded to the annular bonding layer 22, and is a gold layer, for example. The main body 26 is a metal layer having a small linear expansion coefficient, for example, a Kovar layer. Since the frame body 20 and the lid 24 are made of metal, a shielding effect can be given to the frame body 20 and the lid 24 by supplying a ground potential to the via wiring 16a. Further, since the frame body 20 and the lid 24 are made of metal, the acoustic wave element 15 can be sealed into the space 27 with good airtightness. The frame body 20 and the lid 24 are not electrically connected to the acoustic wave element 15 on the support substrate 10.

The piezoelectric layer 13 has a through hole 40 that passes through the piezoelectric layer 13 from the upper surface 14 to a lower surface. Although the through hole 40 is provided as an opening in a part of the piezoelectric layer 13 as an example, the through hole 40 may be provided so as to divide the piezoelectric layer 13 into a plurality of pieces. In the through hole 40, the upper surface 11 of the support substrate 10 is exposed, for example. The columnar body 30 is provided between the support substrate 10 and the lid 24 in the through hole 40. The columnar body 30 is located in the space 27. The columnar body 30 is provided apart from the piezoelectric layer 13. The columnar body 30 includes a metal layer 31 and a bonding layer 32. The metal layer 31 is in contact with the upper surface 11 of the support substrate 10. The bonding layer 32 is provided on the metal layer 31. Thereby, one end of the columnar body 30 is in contact with the upper surface 11 of the support substrate 10, and the other end thereof is bonded to the lid 24.

The metal layer 31 is the metal layer such as the copper layer, the aluminum layer, the platinum layer, the nickel layer or the gold layer, and is made of the same material as the annular metal layer 21 as an example. The bonding layer 32 is the brazing metal layer such as gold tin, silver tin, tin, or tin-silver-copper, and is made of the same material as the annular bonding layer 22 as an example. The columnar body 30 is not limited to being made of metal, but may be made of an insulating material such as ceramic.

The frame body 20 extends around the piezoelectric layer 13 in a substantially rectangular frame shape, and surrounds the piezoelectric layer 13 and the acoustic wave element 15. Therefore, a surface on the side of the support substrate 10 in an inner region 29 of the lid 24 located inside the frame body 20 has a substantially rectangular shape. The term "substantially rectangular shape" also includes the cases where the apexes of the rectangle are rounded to the extent of manufacturing error and/or where each side of the rectangle is curved. The inner region 29 of the lid 24 is exposed to the space 27. The columnar body 30 is located at a center of gravity of the inner region 29 of the lid 24 and is provided between the support substrate 10 and the lid 24.

The support substrate 10 is the sapphire substrate for example, and its thickness is 50 μm to 300 μm for example. The piezoelectric layer 13 is a 42° rotation Y-cut X-propagation lithium tantalate layer for example, and its thickness is 0.5 μm to 30 μm and is the wavelength of the acoustic wave or less, for example. The height of the frame body 20 is 10 μm to 30 μm, for example. The annular metal layer 21 is, for example, a laminated layer in which a copper layer having a thickness of 5 μm to 20 μm and a nickel layer having a thickness of 2.5 μm are laminated from the side of the support substrate 10. The annular bonding layer 22 is a gold tin layer having a thickness of 3.5 μm, for example. The bonding layer 25 of the lid 24 is a gold layer having a thickness of 2 μm, for example. The main body 26 of the lid 24 is a Kovar plate having a thickness of 30 μm to 100 μm, for example. The via wirings 16 and 16a are made of copper having a diameter of 30 μm to 100 μm, for example. The terminal 18 is, for example, a laminated layer in which a copper layer having a thickness of 2 μm, a nickel layer having a thickness of 5 μm, and a gold layer having a thickness of 0.3 μm are laminated from the side of the support substrate 10.

The width of the frame body 20 is 20 μm to 30 μm, for example. Distances between the side surface of the frame body 20 and the side surfaces of the support substrate 10 and the lid 24 are 5 μm to 10 μm, for example. The size of the support substrate 10 is 1.2 mm×1.0 mm, for example. A distance between the lower surface 12 of the support substrate 10 and the upper surface of the lid 24 is 0.15 mm, for example.

The height of the columnar body 30 is substantially the same as that of the frame body 20, and is 10 μm to 30 μm, for example. The length and width of the columnar body 30 are 20 μm to 30 μm. As with the annular metal layer 21, the metal layer 31 is a laminated layer in which a copper layer having a thickness of 5 μm to 20 μm and a nickel layer having a thickness of 2.5 μm are laminated from the side of the support substrate 10, for example. As with the annular bonding layer 22, the bonding layer 32 is a gold tin layer having a thickness of 3.5 μm, for example. A distance D between the columnar body 30 and the piezoelectric layer 13 is 1 μm to 10 μm, for example.

Figure 2:
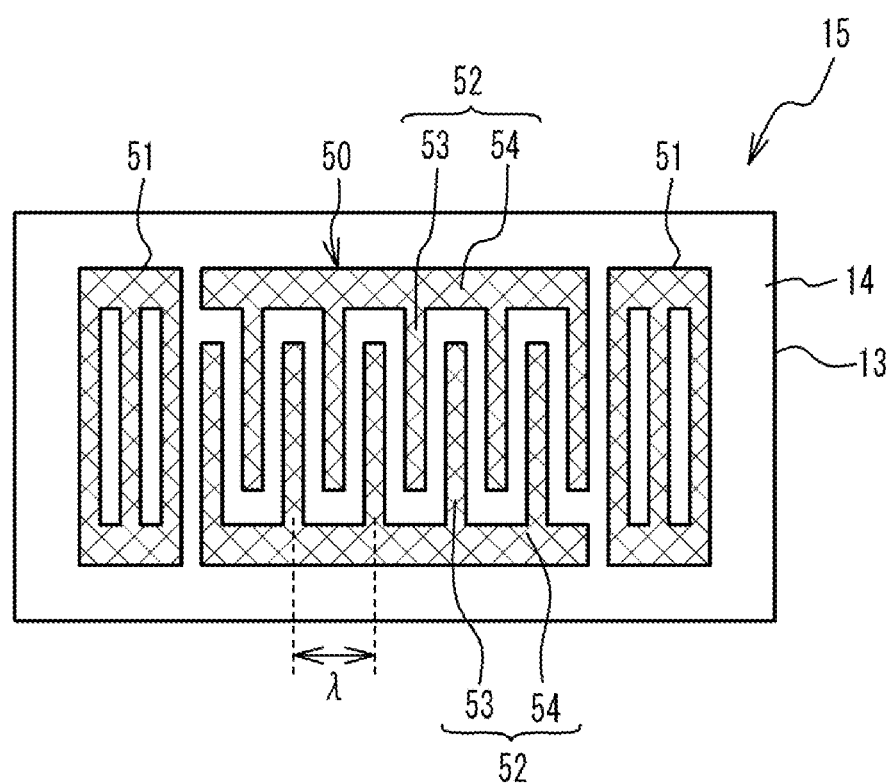
FIG. 2 is a plan view of an acoustic wave element according to the first embodiment.

FIG. 2 is a plan view of an acoustic wave element according to the first embodiment. As illustrated in FIG. 2, the acoustic wave element 15 is a surface acoustic wave resonator. An IDT (Interdigital Transducer) 50 and reflectors 51 are formed on the upper surface 14 of the piezoelectric layer 13. The IDT 50 has a pair of interdigital electrodes 52 facing each other. Each of the interdigital electrodes 52 has a plurality of electrode fingers 53 and a bus bar 54 connecting the plurality of electrode fingers 53. The reflectors 51 are provided on both sides of the IDT 50. The IDT 50 excites a surface acoustic wave on the piezoelectric layer 13. A pitch between the electrode fingers 53 in one of the interdigital electrodes 52 is approximately a wavelength λ of the acoustic wave. That is, the wavelength λ of the acoustic wave is approximately equal to twice a pitch between the electrode fingers 53 in the pair of interdigital electrodes 52. The IDT 50 and the reflectors 51 are made of, for example, a metal film such as an aluminum film, a copper film, or a molybdenum film. A protective film or a temperature compensation film that covers the IDT 50 and the reflectors 51 may be provided on the upper surface 14 of the piezoelectric layer 13.

Figure 3A:
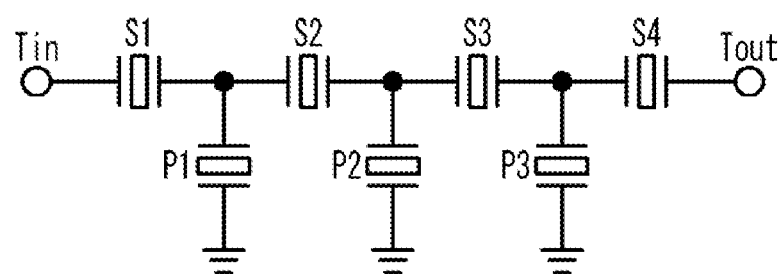
FIG. 3A is a circuit diagram of a filter.
Figure 3B:
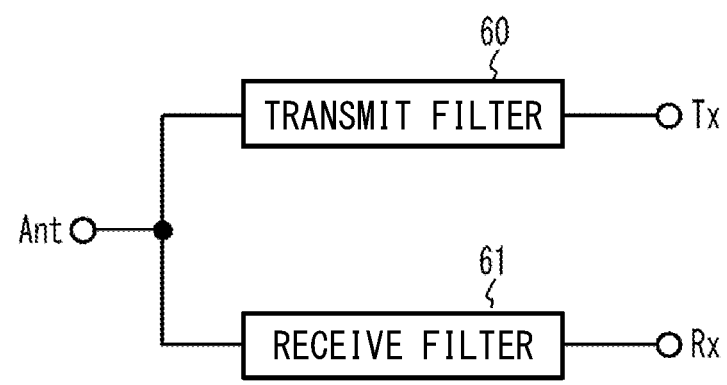
FIG. 3B is a circuit diagram of a duplexer.

A filter or duplexer may be formed with the plurality of acoustic wave elements 15 formed on the upper surface 14 of the piezoelectric layer 13. FIG. 3A is a circuit diagram of the filter, and FIG. 3B is a circuit diagram of the duplexer. As illustrated in FIG. 3A, one or more series resonators S1 to S4 are connected in series between an input terminal Tin and an output terminal Tout. One or more parallel resonators P1 to P3 are connected in parallel between the input terminal Tin and the output terminal Tout. Each of the series resonators S1 to S4 and the parallel resonators P1 to P3 is the acoustic wave element 15. The number of series resonators and the number of parallel resonators can be set as appropriate. Although a ladder type filter is described as an example of the filter, the filter may be a multi-mode type filter.

As illustrated in FIG. 3B, a transmit filter 60 is connected between a common terminal Ant and a transmit terminal Tx. A receive filter 61 is connected between the common terminal Ant and a receive terminal Rx. The transmit filter 60 allows signals in the transmit band as transmission signals to pass through to the common terminal Ant among high-frequency signals input from the transmit terminal Tx, and suppresses other signals with other frequencies. The receive filter 61 allows signals in the receive band as reception signals to pass through to the receive terminal Rx among high-frequency signals input from the common terminal Ant, and suppresses other signals with other frequencies. Although the duplexer is described as an example of the multiplexer, a triplexer or a quadplexer may be used.

Manufacturing Method

Figure 4A:
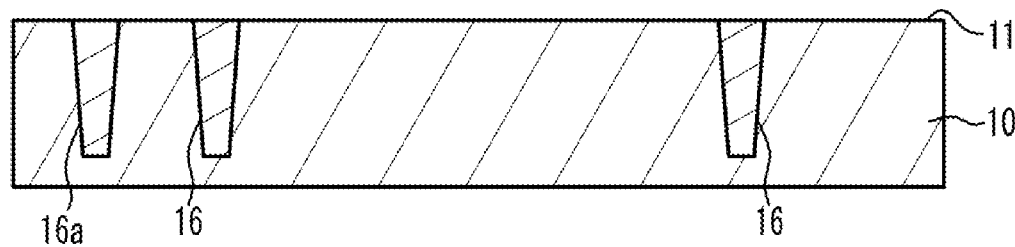
FIGS. 4A to 4D are cross-sectional views illustrating a method of manufacturing the acoustic wave device according to the first embodiment (part 1)

FIGS. 4A to 5C are cross-sectional views illustrating a method of manufacturing the acoustic wave device according to the first embodiment. As shown in FIG. 4A, the upper surface 11 of the support substrate 10 is irradiated with, for example, a laser beam to form a via, and a metal layer such as copper is formed in the via by a plating method for example. Then, the upper surface of the metal layer is flattened by using a CMP (Chemical Mechanical Polishing) method for example such that the upper surface 11 of the support substrate 10 is exposed. Thereby, the via wirings 16 and 16a are formed in the support substrate 10.

Figure 4B:
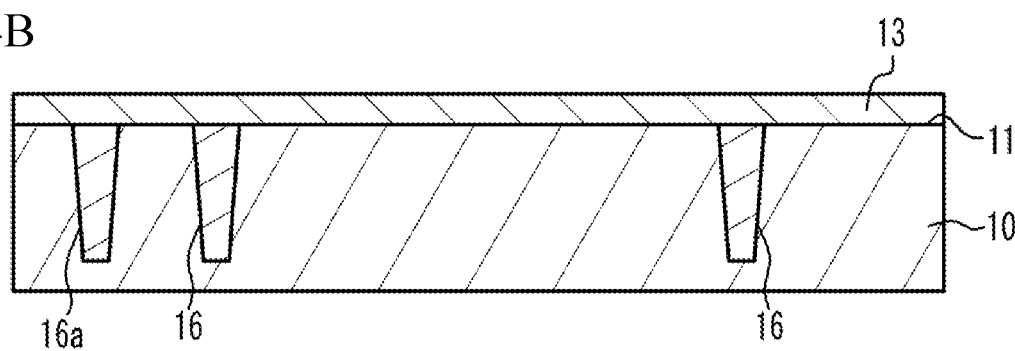

As illustrated in FIG. 4B, a piezoelectric substrate is bonded to the upper surface 11 of the support substrate 10 at room temperature by using a surface activation method, for example. The support substrate 10 and the piezoelectric substrate may be directly bonded via an amorphous layer of several nm or the like, or indirectly bonded via an insulating layer. Then, the upper surface of the piezoelectric substrate is polished by the CMP method, for example. Thereby, the piezoelectric layer 13 directly or indirectly bonded to the upper surface 11 of the support substrate 10 is formed.

Figure 4C:
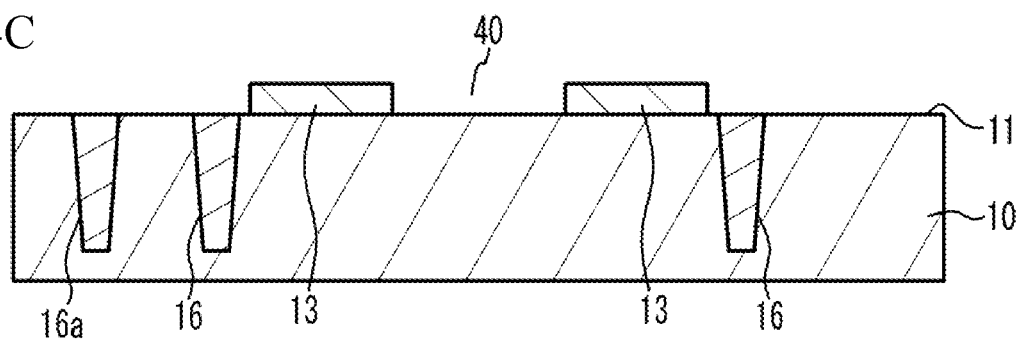

As illustrated in FIG. 4C, a part of the piezoelectric layer 13 is removed by using an etching method, for example. Thereby, the piezoelectric layer 13 in the peripheral region of the support substrate 10 is removed, and the via wirings 16 and 16a are exposed. Further, the through hole 40 is formed in the piezoelectric layer 13. In the through hole 40, for example, the upper surface 11 of the support substrate 10 is exposed.

Figure 4D:
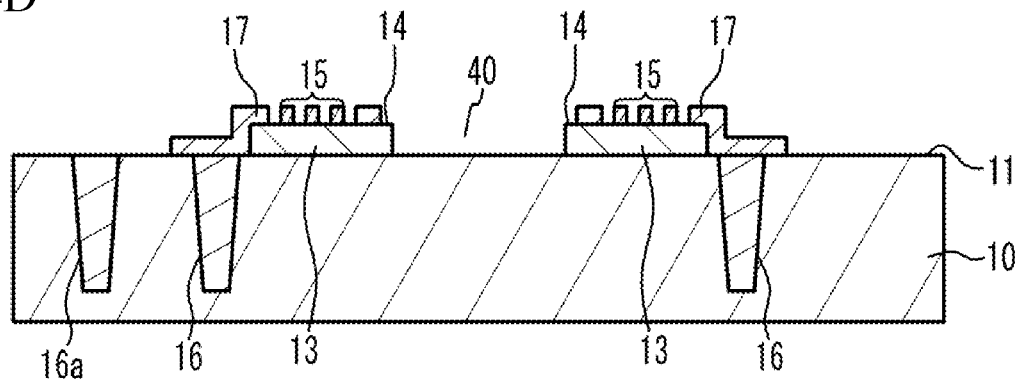

As illustrated in FIG. 4D, the acoustic wave element 15 is formed on the upper surface 14 of the piezoelectric layer 13. The wiring 17 that extends from the upper surface 14 of the piezoelectric layer 13 to the via wiring 16 and electrically connects the acoustic wave element 15 and the via wiring 16 is formed.

Figure 5A:
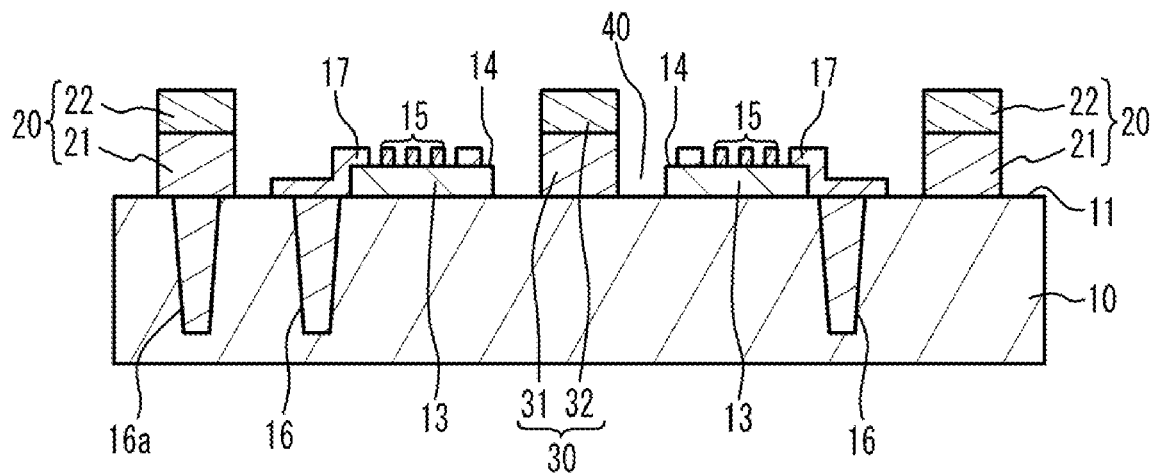
FIGS. 5A to 5C are cross-sectional views illustrating a method of manufacturing the acoustic wave device according to the first embodiment (part 2)

As illustrated in FIG. 5A, the annular metal layer 21 and the annular bonding layer 22 are formed on the upper surface 11 of the support substrate 10 so as to surround the piezoelectric layer 13 and the acoustic wave element 15. Thereby, the frame body 20 is formed. Simultaneously with the formation of the annular metal layer 21 and the annular bonding layer 22, the metal layer 31 made of the same material as the annular metal layer 21 and the bonding layer 32 made of the same material as the annular bonding layer 22 are formed on the upper surface 11 of the support substrate 10 exposed by the through hole 40 of the piezoelectric layer 13. Thereby, the columnar body 30 is formed in the through hole 40.

Figure 5B:
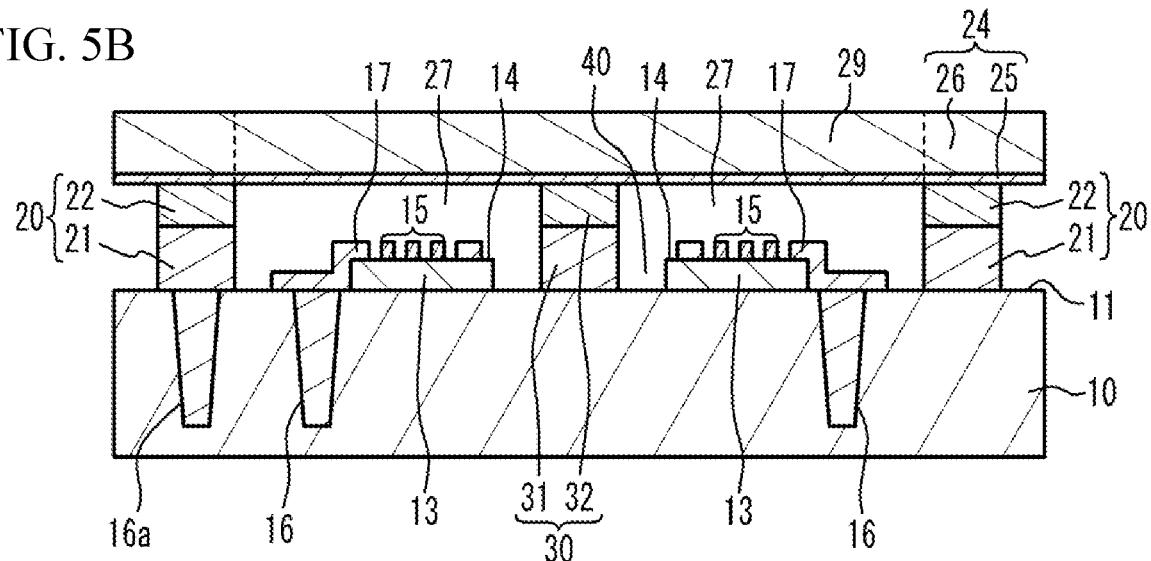

As illustrated in FIG. 5B, the lid 24 is bonded onto the annular bonding layer 22 of the frame body 20. Thereby, the acoustic wave element 15 is sealed into the space 27 by the lid 24 and the frame body 20. The lid 24 is also bonded to the bonding layer 32 of the columnar body 30.

Figure 5C:
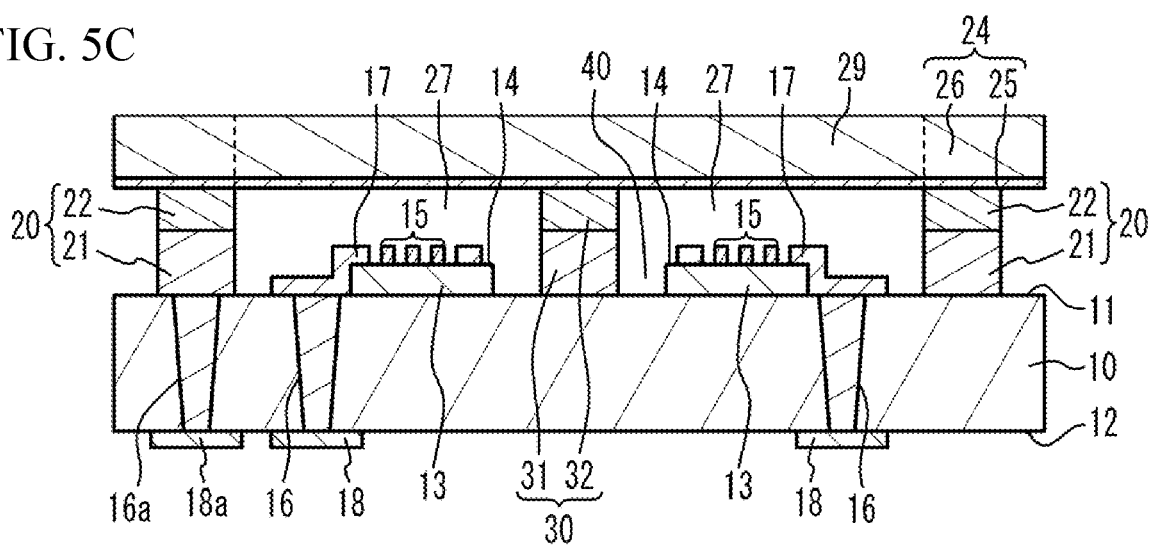

As illustrated in FIG. 5C, the lower surface 12 of the support substrate 10 is polished by the CMP method, for example. Thereby, the via wirings 16 and 16a are exposed from the lower surface 12 of the support substrate 10. The terminals 18 and 18a connected to the via wirings 16 and 16a are formed on the lower surface 12 of the support substrate 10. With the above steps, the acoustic wave device 100 of the first embodiment is manufactured.

Comparative Example

Figure 6A:
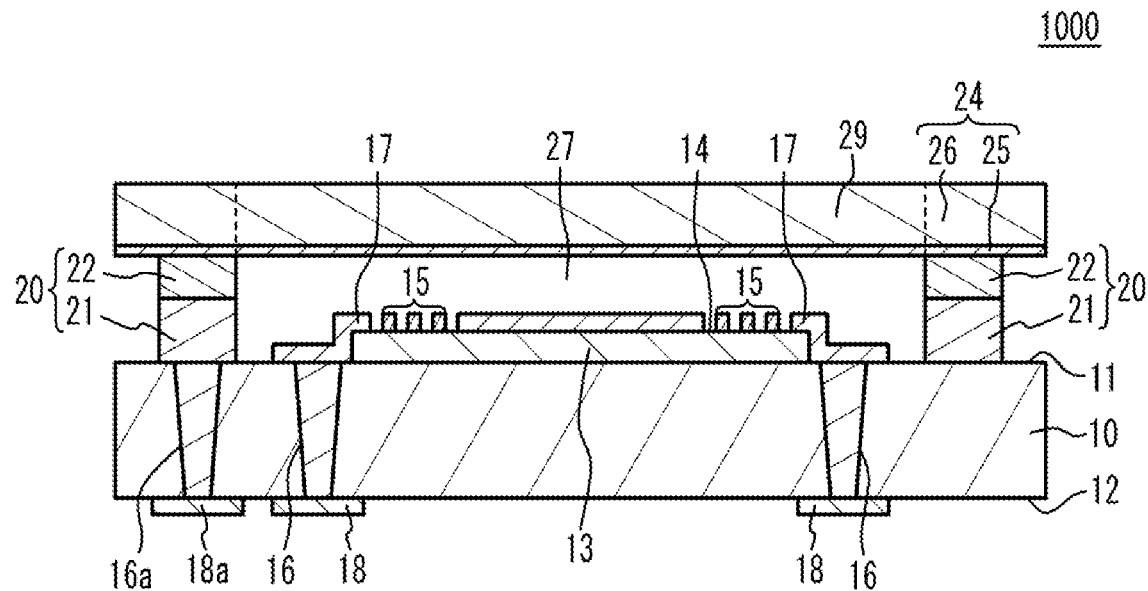
FIG. 6A is a cross-sectional view of an acoustic wave device according to a comparative example.
Figure 6B:
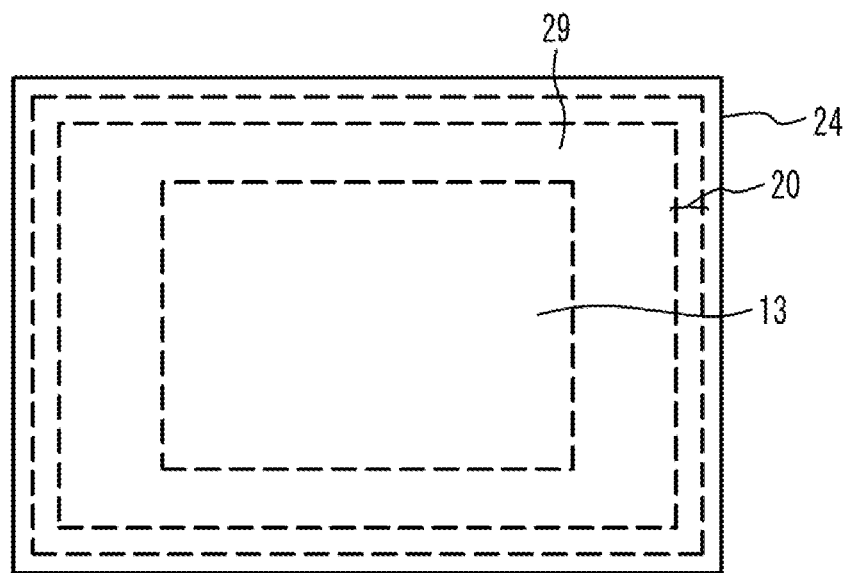
FIG. 6B is a plan view of the acoustic wave device according to the comparative example.

FIG. 6A is a cross-sectional view of an acoustic wave device according to a comparative example, and FIG. 1B is a plan view of the acoustic wave device according to the comparative example. FIG. 6B mainly denotes the lid 24, the frame body 20 and the piezoelectric layer 13. As illustrated in FIGS. 6A and 6B, in an acoustic wave device 1000 of the comparative example, the columnar body 30 is not provided between the support substrate 10 and the lid 24. The other configurations of the acoustic wave device 1000 are the same as those of the acoustic wave device 100 of the first embodiment, and the description thereof will be omitted.

Figure 7:
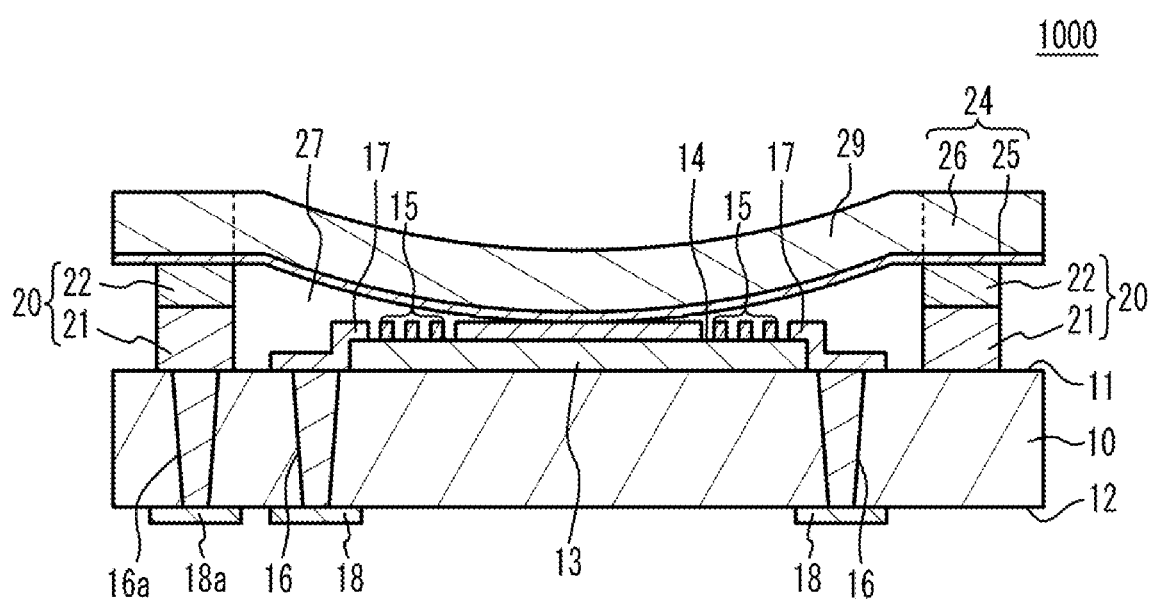
FIG. 7 is a cross-sectional view for explaining a problem that occurs in the acoustic wave device according to the comparative example.

FIG. 7 is a cross-sectional view for explaining a problem that occurs in the acoustic wave device according to the comparative example. For example, when a plurality of electronic components including the acoustic wave device 1000 mounted on a wiring board are sealed with a mold resin, the wiring board is placed in a cavity of a resin sealing device and then the resin is poured into the cavity. When the resin is poured into the cavity, a pressure is applied to the acoustic wave device 1000. In order to improve the airtightness of the space 27, the frame body 20 and the lid 24 are preferably made of metal. However, when the lid 24 is made of metal, the malleability becomes high. Therefore, when the pressure is applied to the lid 24, the lid 24 may deflect as illustrated in FIG. 7. When the lid 24 deflects, the lid 24 is into contact with the acoustic wave element 15 and/or the wiring 17, and the characteristics may deteriorate.

Simulation

Figure 8A:
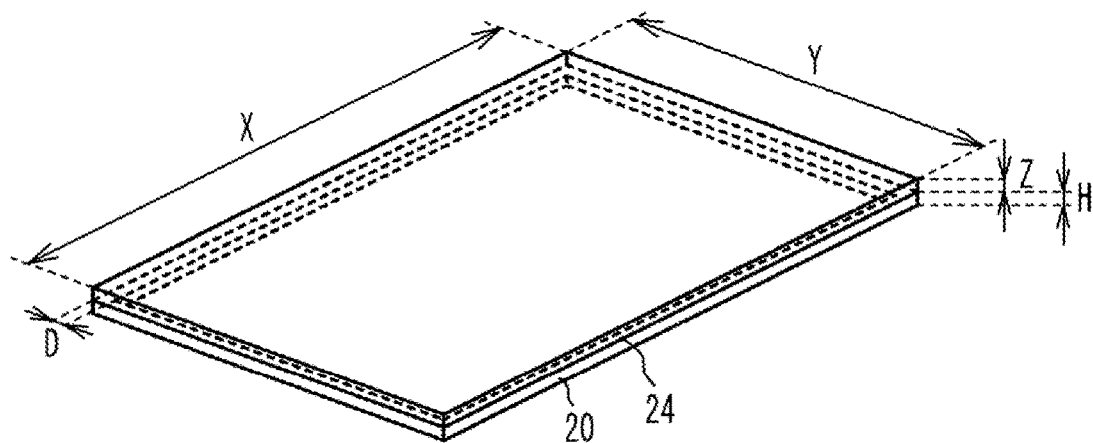
FIG. 8A is a perspective view of a model used for simulation A.
Figure 8B:
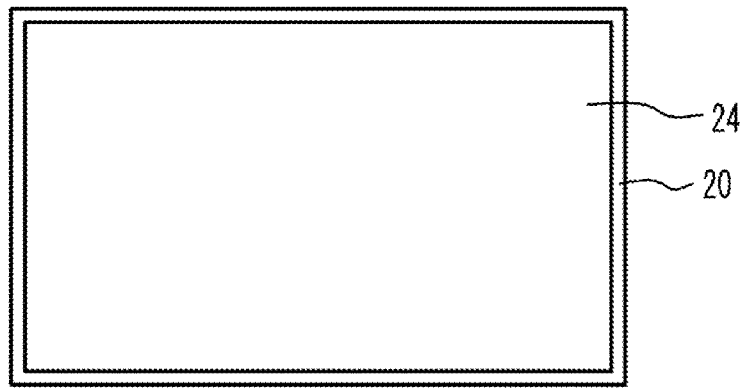
FIG. 8B is a plan view of the model used for the simulation A.
Figure 8C:
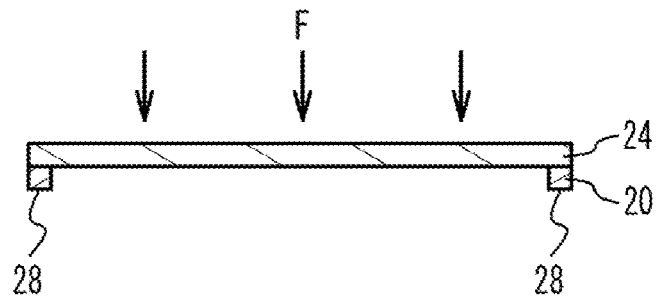
FIG. 8C is a cross-sectional view of the model used for the simulation A.

A description will be given of simulation that calculates the deflection when the pressure is applied to the lid. The simulation was performed using a simple model in which only the frame body 20 and the lid 24 were considered. FIG. 8A is a perspective view of a model used for simulation A, FIG. 8B is a plan view of the model used for the simulation A, and FIG. 8C is a cross-sectional view of the model used for the simulation A. As illustrated in FIGS. 8A to 8C, the lid 24 is a rectangular parallelepiped shape having a length X of 1.284 mm, a width Y of 0.784 mm, and a height Z of 30 μm. The frame body 20 has a width D of 23 μm and a height H of 20 μm. The lid 24 is made of Kovar having a Young's modulus of 138 GPa and a Poisson's ratio of 0.317. The frame body 20 is made of copper having a Young's modulus of 110 GPa and a Poisson's ratio of 0.343. As illustrated in FIG. 8C, the deflection of the lid 24 was simulated when a lower surface 28 of the frame body 20 was fixed and a pressure F was applied to the upper surface of the lid 24. The pressure F was set at 6 MPa which corresponded to the pressure at the time of forming mold resin.

Figure 9A:
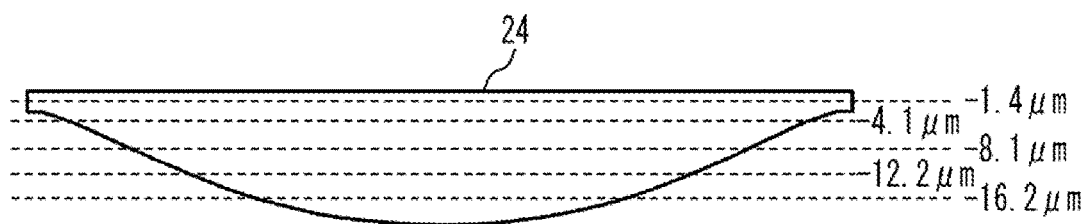
FIGS. 9A and 9B are views illustrating the deflection of a lid in the simulation A.
Figure 9B:
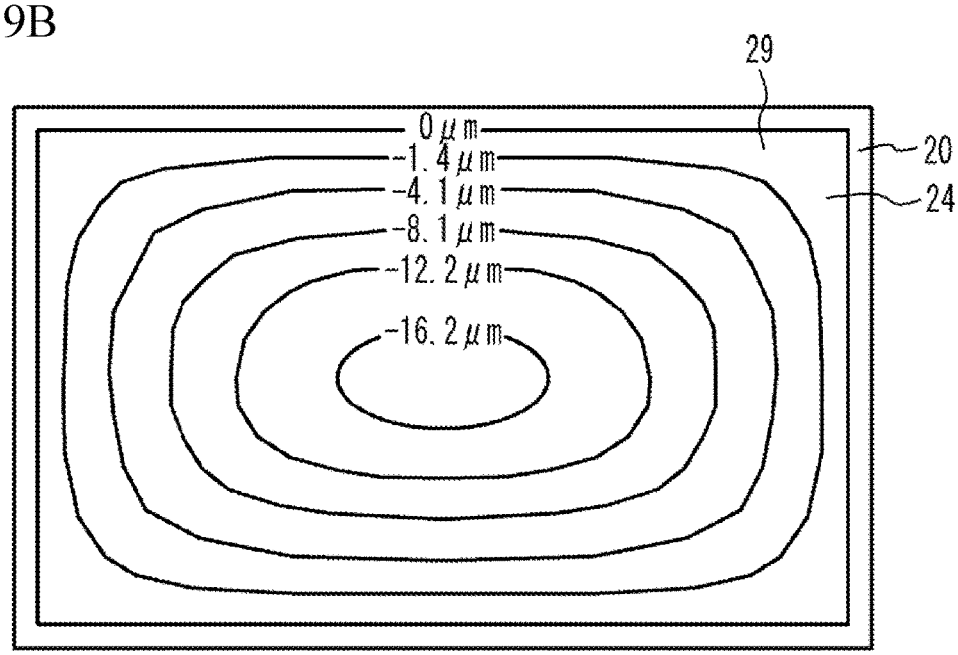

FIGS. 9A and 9B are views illustrating the deflection of the lid in the simulation A. FIG. 9A is a side view illustrating an amount of deflection from a reference, with a portion where the lid 24 is not deflected as the reference, and FIG. 9B is a contour map (these also apply to the following simulation results). Regarding the amount of deflection, the deflection toward the frame body 20 is expressed as a negative value. As illustrated in FIGS. 9A and 9B, the closer to the center of gravity of the inner region 29 of the lid 24, the larger the amount of deflection. A maximum deflection amount was −17.6 μm.

Simulation was also performed when the pressure F was set to 12 MPa and 18 MPa corresponding to a hydrostatic pressure test. Even in this case, it was confirmed that the lid 24 deflects in the same shape as in FIGS. 9A and 9B. The maximum deflection amount was −35.2 μm when the pressure F was 12 MPa, and the maximum deflection amount was −52.8 μm when the pressure F was 18 MPa.

Figure 10A:
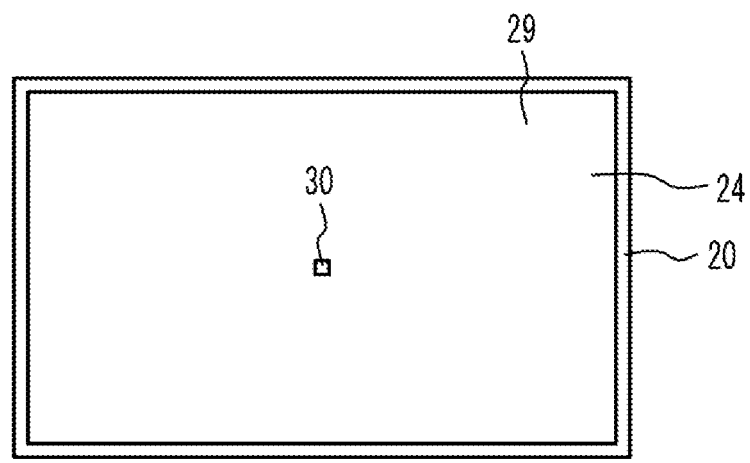
FIG. 10A is a plan view of a model used for simulation B.
Figure 10B:
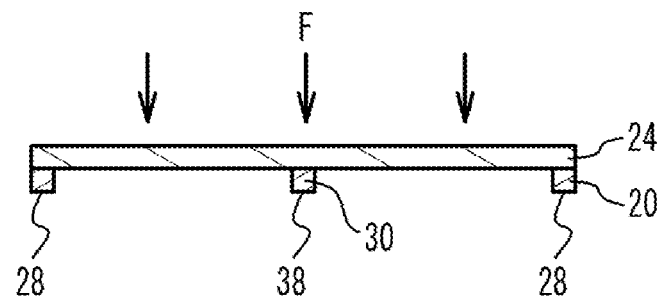
FIG. 10B is a cross-sectional view of the model used for the simulation B.

FIG. 10A is a plan view of a model used for simulation B, and FIG. 10B is a cross-sectional view of the model used for the simulation B. As illustrated in FIGS. 10A and 10B, in the simulation B, the columnar body 30 is provided at the center of gravity of the inner region 29 of the lid 24. The columnar body 30 is a rectangular parallelepiped shape having a length of 23 μm, a width of 23 μm, and a height of 20 μm. The columnar body 30 is made of copper having a Young's modulus of 110 GPa and a Poisson's ratio of 0.343. The other configurations of the simulation B are the same as those of the simulation A. As illustrated in FIG. 10B, the deflection of the lid 24 was simulated when the lower surface 28 of the frame body 20 and a lower surface 38 of the columnar body 30 were fixed and the pressure F of 6 Mpa was applied to the upper surface of the lid 24.

Figure 11A:
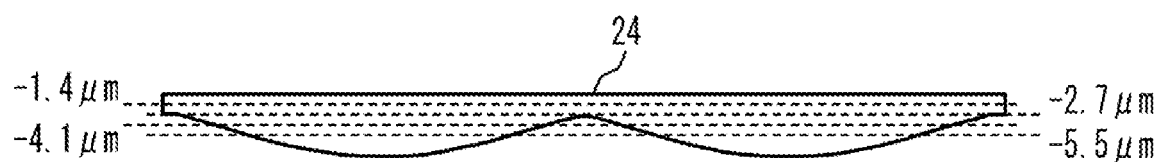
FIGS. 11A and 11B are views illustrating the deflection of a lid in the simulation B.
Figure 11B:
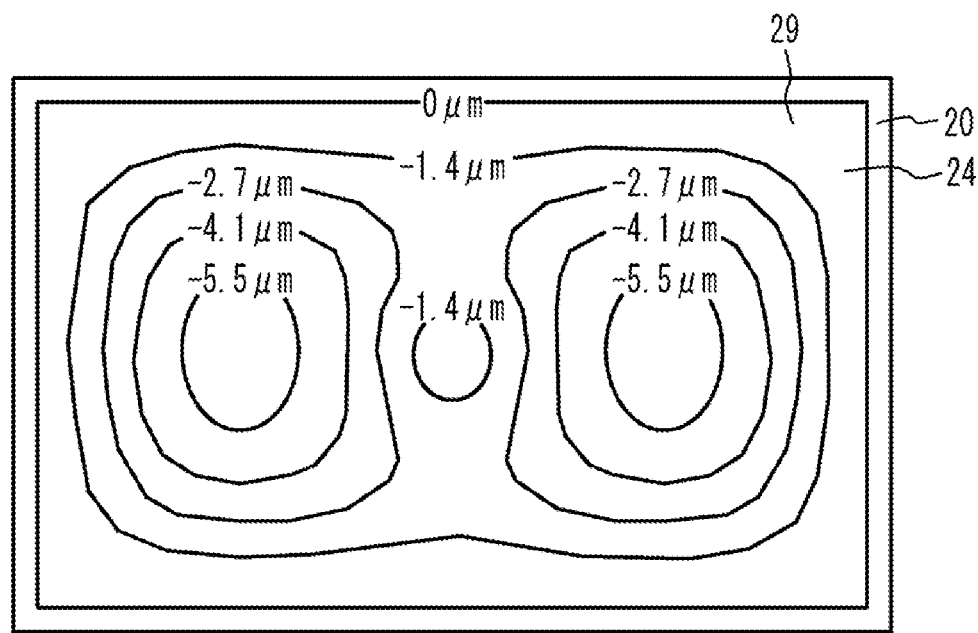

FIGS. 11A and 11B are views illustrating the deflection of the lid in the simulation B. When the columnar body 30 was provided as illustrated in FIGS. 11A and 11B, the maximum deflection amount was −6.4 μm.

The acoustic wave device 1000 of the comparative example does not have the columnar body 30 as illustrated in FIGS. 6A and 6B. In this case, the deflection of the lid 24 becomes large when the pressure F is applied to the lid 24 as illustrated in FIGS. 9A and 9B. Therefore, in the acoustic wave device 1000 of the comparative example, the lid 24 deflects and is into contact with the acoustic wave element 15 and/or the wiring 17 as illustrated in FIG. 7, and the characteristics may deteriorate.

On the other hand, according to the acoustic wave device 100 of the first embodiment, the columnar body 30 is provided between the support substrate 10 and the lid 24 in the space 27 as illustrated in FIGS. 1A and 1B. In this case, the deflection of the lid 24 can be reduced even when the pressure F is applied to the lid 24 as illustrated in FIGS. 11A and 11B. Therefore, the lid 24 can be prevented from being in contact with the acoustic wave element 15 and the wiring 17, and the deterioration of the characteristics can be suppressed. The length and the width of the columnar body 30 are preferably 20 μm or more, more preferably 30 μm or more, and even more preferably 40 μm or more in terms of reducing the deflection of the lid 24. Also, the length and the width of the columnar body 30 are preferably 100 μm or less, more preferably 80 μm or less, and even more preferably 60 μm or less in terms of reducing an area of the piezoelectric layer 13.

The piezoelectric layer 13 preferably has the through hole 40 passing therethrough, and the columnar body 30 is preferably provided between the support substrate 10 and the lid 24 in the through hole 40. Thereby, a load is suppressed from being applied to the piezoelectric layer 13 even when the pressure is applied to the lid 24 and the columnar body 30 is pushed. Therefore, the generation of cracks in the piezoelectric layer 13 can be suppressed.

The height of the columnar body 30 is preferably larger than the distance from the upper surface 11 of the support substrate 10 to the upper surfaces of the interdigital electrodes 52 forming the acoustic wave element 15. This prevents the lid 24 from being in contact with the acoustic wave element 15 even when the lid 24 deflects, thereby suppressing the deterioration of the characteristics.

The piezoelectric layer 13 is a single crystal lithium tantalate layer or a single crystal lithium niobate layer. In this case, since the piezoelectric layer 13 has cleavage property, the piezoelectric layer 13 is easily broken when a load is applied thereto. In such a case, the columnar body 30 is preferably provided between the support substrate 10 and the lid 24 in the through hole 40 of the piezoelectric layer 13. Further, in a case where the thickness of the piezoelectric layer 13 is equal to or less than the wavelength λ of the acoustic wave, the piezoelectric layer 13 is easily broken when the load is applied thereto. Therefore, even in such a case, the columnar body 30 is preferably provided between the support substrate 10 and the lid 24 in the through hole 40 of the piezoelectric layer 13.

In order to suppress the load from being applied to the piezoelectric layer 13 when the columnar body 30 is pushed by the lid 24, it is preferable that the columnar body 30 is provided away from the piezoelectric layer 13. The distance D between the columnar body 30 and the piezoelectric layer 13 is preferably 2 µm or more and 10 µm or less, more preferably 3 µm or more and 8 µm or less, and further preferably 4 µm or more and 6 µm or less, in terms of suppressing the load to be applied to the piezoelectric layer 13 and suppressing an increase in size of the acoustic wave device.

The columnar body 30 is in contact with one of the support substrate 10 and the lid 24 and not in contact with the other thereof, and a gap may be formed. However, in order to effectively reduce the deflection of the lid 24, it is preferable that one of end surfaces of the columnar body 30 is in contact with the support substrate 10 and the other of the end surfaces is in contact with the lid 24.

The columnar body 30 is preferably provided at the center of gravity of the inner region 29 of the lid 24 and provided between the support substrate 10 and the lid 24. Thereby, even when the pressure is applied to the lid 24, the deflection of the lid 24 can be effectively reduced.

In order to reduce the height of the acoustic wave device 100, the thickness of the lid 24 is preferably smaller than the thickness of the support substrate 10. In this case, the lid 24 easily deflects when the pressure is applied thereto. Therefore, in such a case, it is preferable to provide the columnar body 30.

It is preferable that the wiring 17 is not provided below the columnar body 30. Thereby, even when the pressure is applied to the lid 24 and the columnar body 30 is pushed, the propagation of a stress to the piezoelectric layer 13 via the wiring 17 is suppressed, and the generation of cracks in the piezoelectric layer 13 can be suppressed.

First Variation of First Embodiment

Figure 12:
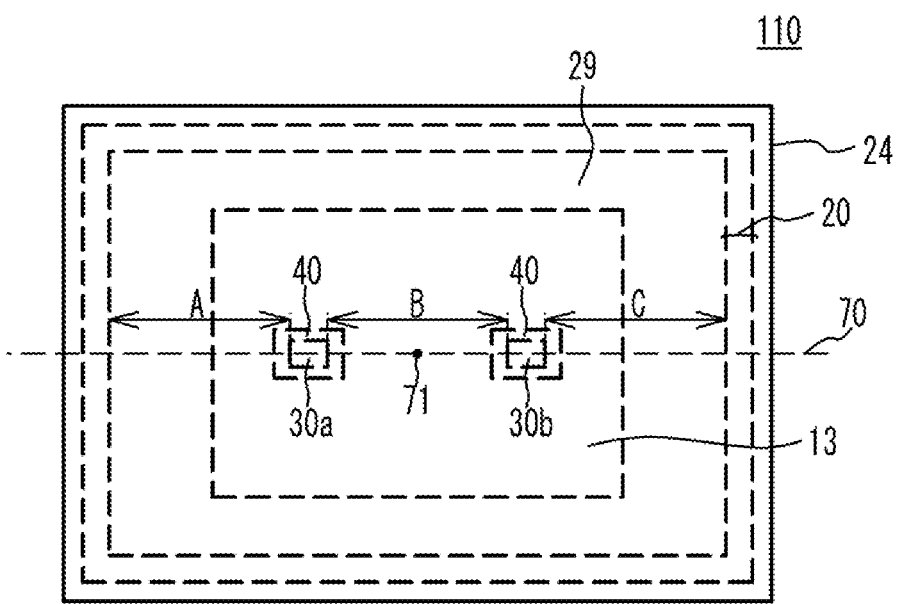
FIG. 12 is a plan view of an acoustic wave device according to a first variation of the first embodiment.

FIG. 12 is a plan view of an acoustic wave device according to a first variation of the first embodiment. FIG. 12 mainly denotes the lid 24, the frame body 20, the piezoelectric layer 13 and columnar bodies 30a and 30b. As illustrated in FIG. 12, in an acoustic wave device 110 of the first variation of the first embodiment, the columnar bodies 30a and 30b are located on a virtual line 70 along a longitudinal direction of the inner region 29 when the inner region 29 of the lid 24 is viewed in a plan view, and the columnar bodies 30a and 30b are provided between the support substrate 10 and the lid 24. The columnar bodies 30a and 30b are provided at positions symmetrical to each other with respect to a center of gravity 71 of the inner region 29 of the lid 24, for example. For example, a distance A between the frame body 20 and the columnar body 30a, a distance B between the columnar bodies 30a and 30b, and a distance C between the columnar body 30b and the frame body 20 are approximately the same size to each other. The other configurations of the acoustic wave device 110 are the same as those of the acoustic wave device 100 of the first embodiment, and the description thereof will be omitted.

Simulation

Figure 13:
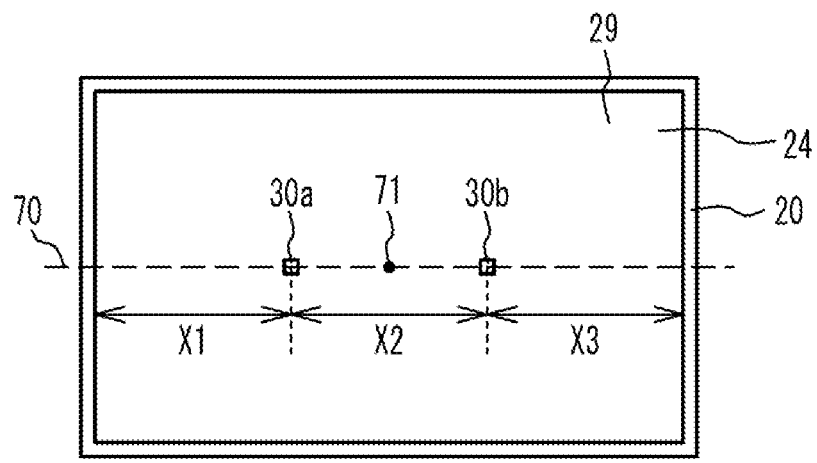
FIG. 13 is a plan view of a model used for simulation C.

FIG. 13 is a plan view of a model used for simulation C. In the simulation C, the columnar bodies 30a and 30b are located on the virtual line 70 along the longitudinal direction of the inner region 29 when the inner region 29 of the lid 24 is viewed in the plan view. The columnar bodies 30a and 30b are provided at positions symmetrical to each other with respect to the center of gravity 71 of the inner region 29 of the lid 24. A distance X1 between the frame body 20 and the center of the columnar body 30a, a distance X2 between the centers of the columnar bodies 30a and 30b, and a distance X3 between the center of the columnar body 30b and the frame body 20 are all of the same size, i.e., 0.448 mm. As with the simulation B, each of the columnar bodies 30a and 30b is the rectangular parallelepiped shape having a length of 23 µm, a width of 23 µm, and a height of 20 µm, and is made of copper having a Young's modulus of 110 GPa and a Poisson's ratio of 0.343. The other configurations of the simulation C are the same as those of the simulation A. The deflection of the lid 24 was simulated when the lower surfaces of the frame body 20 and the columnar bodies 30a and 30b were fixed and the pressure F of 6 Mpa was applied to the upper surface of the lid 24.

Figure 14A:
FIGS. 14A and 14B are views illustrating the deflection of a lid in the simulation C.
Figure 14B:
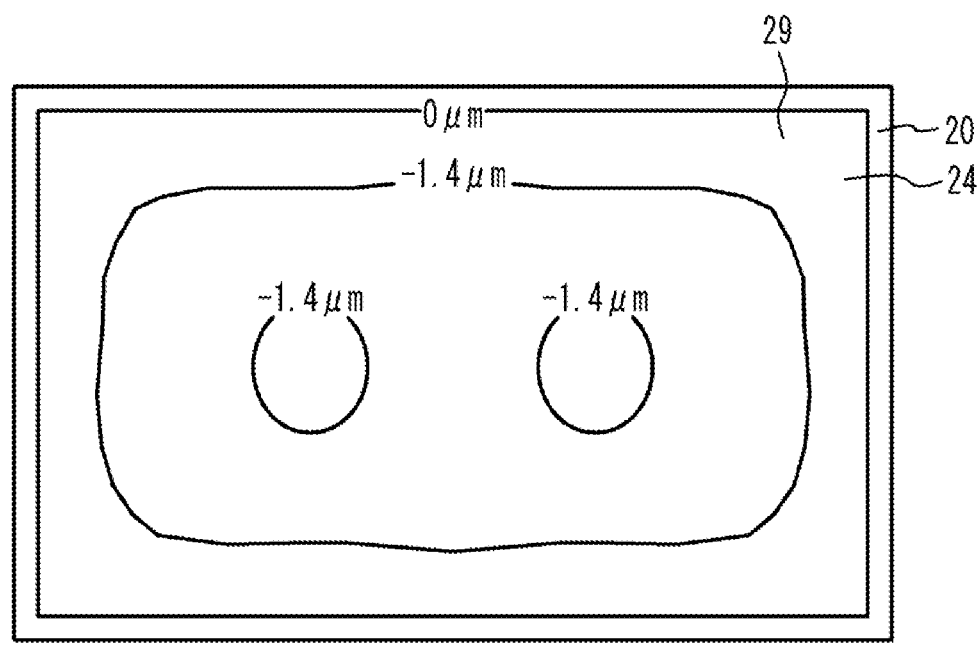

FIGS. 14A and 14B are views illustrating the deflection of the lid in the simulation C. When the columnar bodies 30a and 30b were provided as illustrated in FIGS. 14A and 14B, the maximum deflection amount was reduced to −2.5 µm.

As indicated by the first variation of the first embodiment, the columnar bodies 30a and 30b may be located on the virtual line 70 along the longitudinal direction of the inner region 29, and may be provided between the support substrate 10 and the lid 24. Thereby, the deflection of the lid 24 can be reduced. In terms of reducing the deflection of the lid 24, it is preferable that the columnar bodies 30a and 30b are provided at positions symmetrical to each other with respect to the center of gravity 71 of the inner region 29 of the lid 24. Further, the columnar bodies 30a and 30b are preferably provided such that the distance A between the frame body 20 and the columnar body 30a, the distance B between the columnar bodies 30a and 30b, and the distance C between the columnar body 30b and the frame body 20 are approximately the same size to each other. The term "approximately the same" includes differences in the degree of manufacturing error.

Second Variation of First Embodiment

Figure 15:
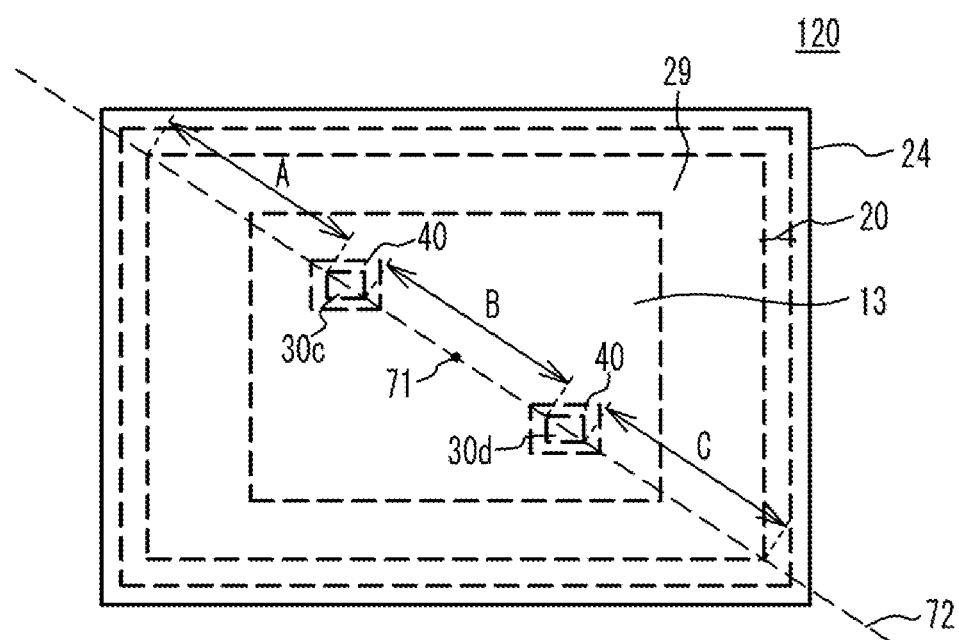
FIG. 15 is a plan view of an acoustic wave device according to a second variation of the first embodiment.

FIG. 15 is a plan view of an acoustic wave device according to a second variation of the first embodiment. As illustrated in FIG. 15, in an acoustic wave device 120 of the second variation of the first embodiment, columnar bodies 30c and 30d are located on a diagonal line 72 of the inner region 29 when the inner region 29 of the lid 24 is viewed in a plan view, and the columnar bodies 30c and 30d are provided between the support substrate 10 and the lid 24. The columnar bodies 30c and 30d are provided at positions symmetrical to each other with respect to the center of gravity 71 of the inner region 29 of the lid 24, for example. For example, a distance A between a corner of the inner region 29 and the columnar body 30c, a distance B between the columnar bodies 30c and 30d, and a distance C between the columnar body 30d and another corner of the inner region 29 are approximately the same size to each other. The other configurations of the acoustic wave device 120 are the same as those of the acoustic wave device 100 of the first embodiment, and the description thereof will be omitted.

Simulation

Figure 16:
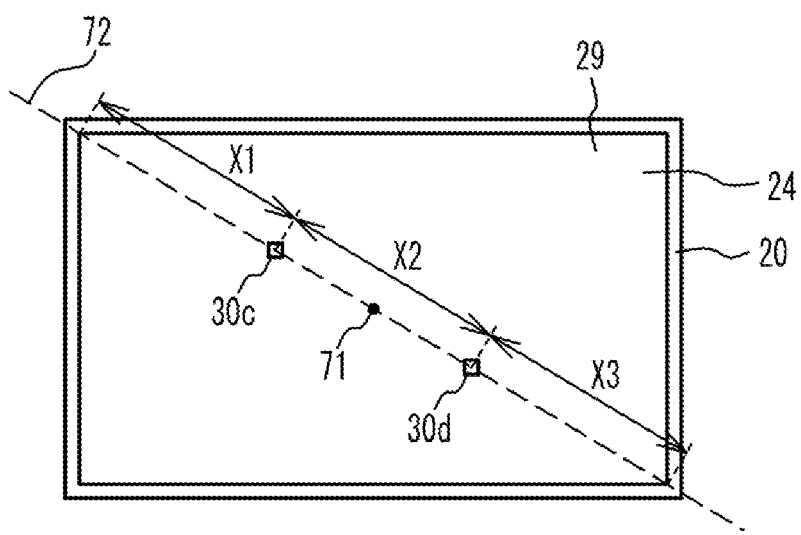
FIG. 16 is a plan view of a model used for simulation D.

FIG. 16 is a plan view of a model used for simulation D. In the simulation D, the columnar bodies 30c and 30d are located on the diagonal line 72 of the inner region 29 when the inner region 29 of the lid 24 is viewed in the plan view. The columnar bodies 30c and 30d are provided at positions symmetrical to each other with respect to the center of gravity 71 of the inner region 29 of the lid 24. A distance X1 between the corner of the inner region 29 of the lid 24 and the center of the columnar body 30c, a distance X2 between the centers of the columnar bodies 30c and 30d, and a distance X3 between the center of the columnar body 30d and another corner of the inner region 29 of the lid 24 are all of the same size, i.e., 0.478 mm. As with the simulation B, each of the columnar bodies 30a and 30b is the rectangular parallelepiped shape having a length of 23 μm, a width of 23 μm, and a height of 20 μm, and is made of copper having a Young's modulus of 110 GPa and a Poisson's ratio of 0.343. The other configurations of the simulation D are the same as those of the simulation A. The deflection of the lid 24 was simulated when the lower surfaces of the frame body 20 and the columnar bodies 30c and 30d were fixed and the pressure F of 6 Mpa was applied to the upper surface of the lid 24.

Figure 17A:
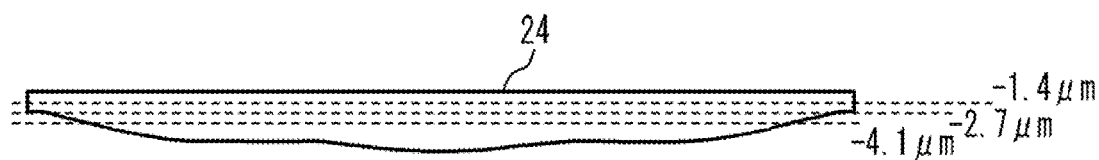
FIGS. 17A and 17B are views illustrating the deflection of a lid in the simulation D.
Figure 17B:
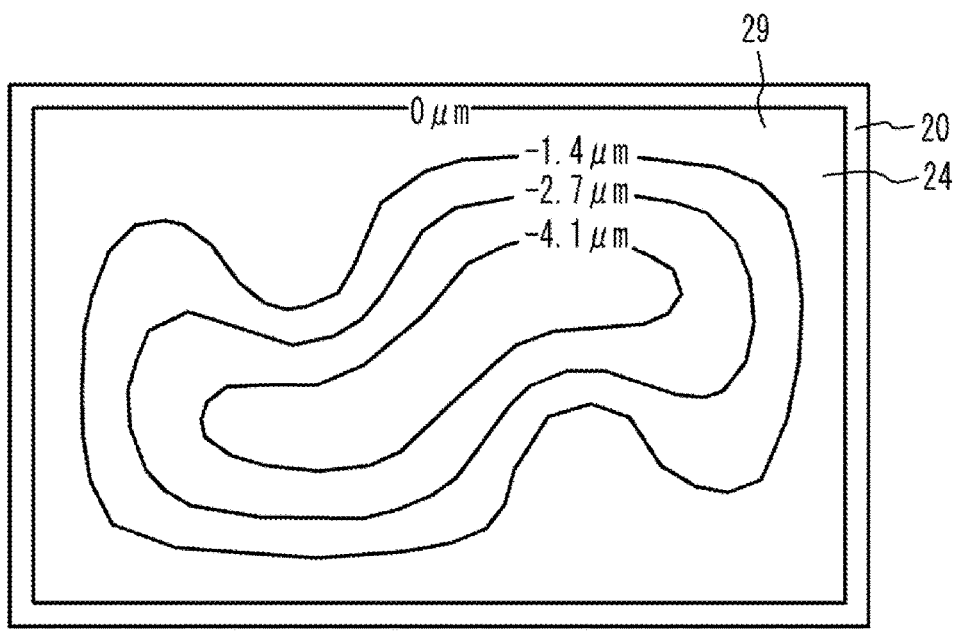

FIGS. 17A and 17B are views illustrating the deflection of the lid in the simulation D. When the columnar bodies 30c and 30d were provided as illustrated in FIGS. 17A and 17B, the maximum deflection amount was reduced to −4.7 μm.

As indicated by the second variation of the first embodiment, the columnar bodies 30c and 30d may be located on the diagonal line 72 of the inner region 29, and may be provided between the support substrate 10 and the lid 24. Thereby, the deflection of the lid 24 can be reduced. In terms of reducing the deflection of the lid 24, it is preferable that the columnar bodies 30c and 30d are provided at positions symmetrical to each other with respect to the center of gravity 71 of the inner region 29 of the lid 24. Further, the columnar bodies 30c and 30d are preferably provided such that the distance A between the corner of the inner region 29 and the columnar body 30c, the distance B between the columnar bodies 30c and 30d, and the distance C between the columnar body 30d and another corner of the inner region 29 are approximately the same size to each other.

In the first modification and the second modification of the first embodiment, two columnar bodies are provided as an example, but three or more columnar bodies may be provided.

Second Embodiment

Figure 18:
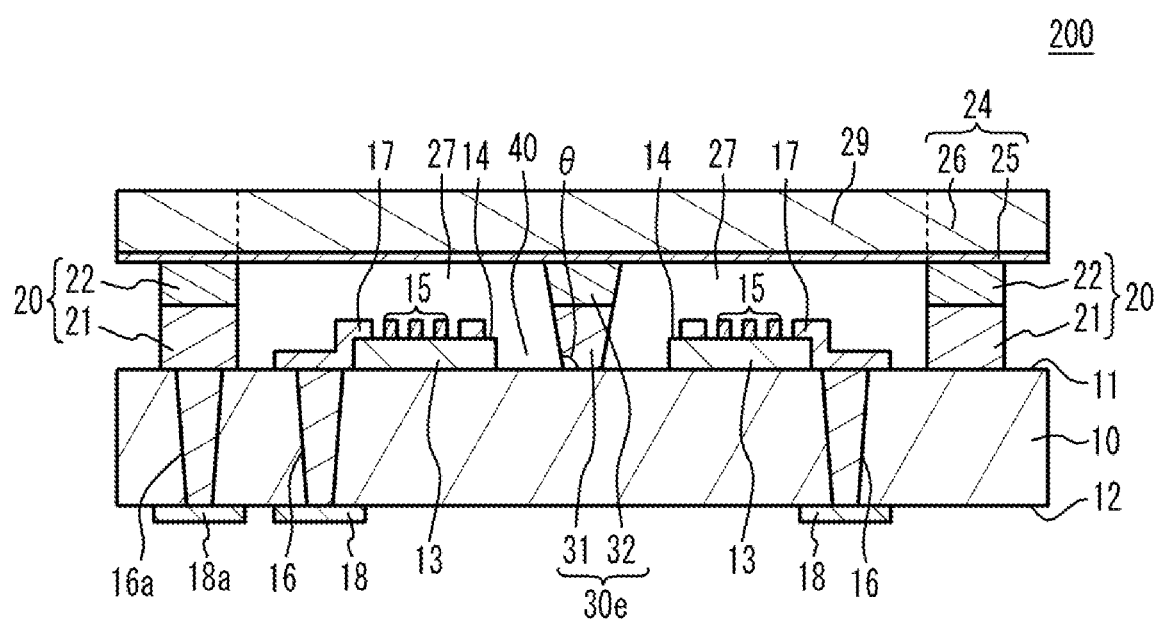
FIG. 18 is a cross-sectional view of an acoustic wave device according to a second embodiment.

FIG. 18 is a cross-sectional view of an acoustic wave device according to a second embodiment. As illustrated in FIG. 18, in an acoustic wave device 200 of the second embodiment, a columnar body 30e has a width which narrows from the lid 24 toward the support substrate 10. An angle θ from the columnar body 30e between the side surface of the columnar body 30e and the upper surface 11 of the support substrate 10 may be, for example, more than 90° and 130° or less, 95° or more and 120° or less, or 100° or more and 110° or less. The other configurations of the acoustic wave device 200 are the same as those of the acoustic wave device 100 of the first embodiment, and the description thereof will be omitted.

According to the second embodiment, the columnar body 30e has the width which narrows from the lid 24 toward the support substrate 10. The lid 24 is preferably connected to a ground for shielding. The columnar body 30e is preferably made of metal in order to enhance rigidity. In this case, the column 30e is at ground potential. In such a case, in order to reduce parasitic capacitance between the columnar body 30e, and the acoustic wave element 15 and the wiring 17, it is preferable that the width of the columnar body 30e is narrowed from the lid 24 toward the support substrate 10, and the distance between the columnar body 30e, and the acoustic wave element 15 and the wiring 17 is increased. Here, the columnar body 30e is not electrically connected to the acoustic wave element 15 on the support substrate 10.

Third Embodiment

Figure 19:
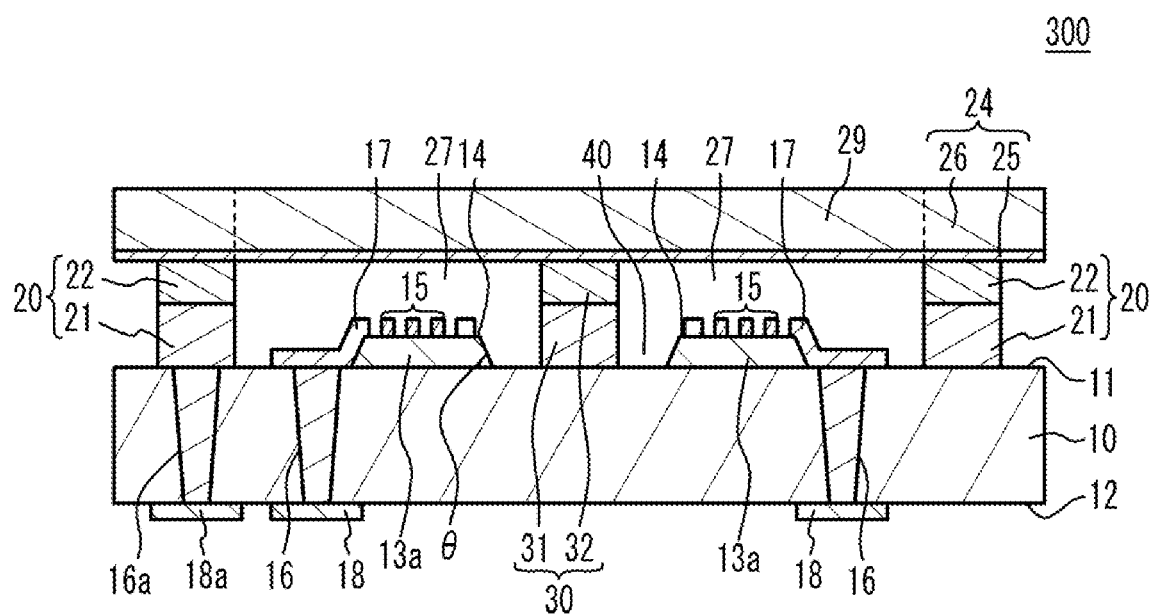
FIG. 19 is a cross-sectional view of an acoustic wave device according to a third embodiment.

FIG. 19 is a cross-sectional view of an acoustic wave device according to a third embodiment. As illustrated in FIG. 19, in an acoustic wave device 300 of the third embodiment, a side surface of a piezoelectric layer 13a in the through hole 40 has a tapered shape that is inclined so as to spread toward the support substrate 10. An angle θ from the side surface of the piezoelectric layer 13a between the side surface of the piezoelectric layer 13a and the upper surface 11 of the support substrate 10 may be less than 90° and 65° or more, 85° or less and 70° or more, or 80° or less and 75° or more. The other configurations of the acoustic wave device 300 are the same as those of the acoustic wave device 100 of the first embodiment, and the description thereof will be omitted.

According to the third embodiment, the side surface of the piezoelectric layer 13a in the through hole 40 is inclined so as to spread toward the support substrate 10. Thereby, the distance between the columnar body 30, and the acoustic wave element 15 and the wiring 17 can be increased, and the parasitic capacitance between the columnar body 30, and the acoustic wave element 15 and the wiring 17 can be reduced.

Also in the third embodiment, the columnar body 30e having the width which narrows from the lid 24 toward the support substrate 10 may be used, as in the second embodiment.

Fourth Embodiment

Figure 20:
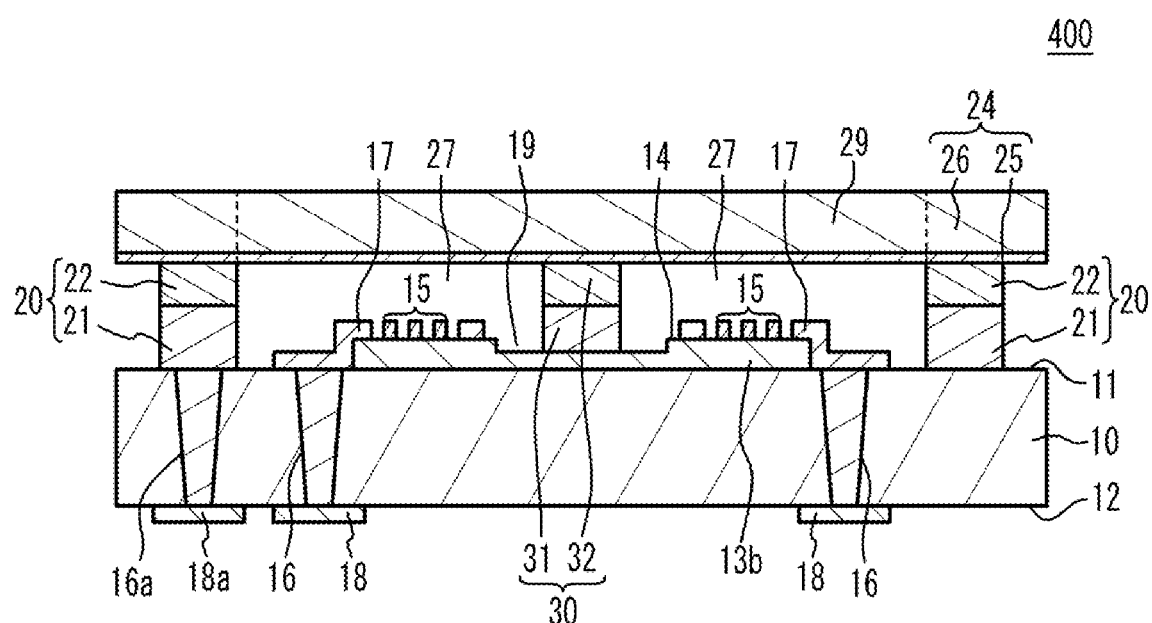
FIG. 20 is a cross-sectional view of an acoustic wave device according to a fourth embodiment.

FIG. 20 is a cross-sectional view of an acoustic wave device according to a fourth embodiment. In an acoustic wave device 400 of the fourth embodiment, the piezoelectric layer 13b does not have the through hole 40 but has a recess 19 on the upper surface 14. A piezoelectric layer 13b is present at a bottom surface of the recess 19. The columnar body 30 is provided between the support substrate 10 and the lid 24 in the recess 19. For example, one of the end surfaces of the columnar body 30 is in contact with the bottom surface of the recess 19, and the other thereof is in contact with the lid 24. The depth of the recess 19 may be ¼ or more and ¾ or less, or ⅓ or more and ⅔ or less of the thickness of the piezoelectric layer 13b, for example. The other configurations of the acoustic wave device 400 are the same as those of the acoustic wave device 100 of the first embodiment, and the description thereof will be omitted.

According to the third embodiment, the columnar body 30 is provided between the support substrate 10 and the lid 24 in the recess 19 of the piezoelectric layer 13b. Thereby, when the pressure is applied to the lid 24 and the columnar body 30 is pushed, a load is applied to the bottom surface of the recess 19 of the piezoelectric layer 13b. Therefore, the generation of cracks on the upper surface 14 the piezoelectric layer 13 can be suppressed, and the characteristic deterioration of the acoustic wave element 15 can be suppressed.

The height of the columnar body 30 is preferably larger than a distance from the bottom surface of the recess 19 to the upper surfaces of the interdigital electrodes 52 forming the acoustic wave element 15. Thereby, even if the lid 24 deflects, it is possible to suppress the lid 24 from being in contact with the acoustic wave element 15 and suppress deterioration of the characteristics.

The columnar body 30 may be in contact with one of the bottom surface of the recess 19 or the lid 24 of the piezoelectric layer 13b, but may not be in contact with the other thereof and a gap may be formed. However, in order to effectively reduce the deflection of the lid 24, it is preferable that one of the end surfaces of the columnar body 30 is in contact with the bottom surface of the recess 19 of the piezoelectric layer 13b and the other thereof is in contact with the lid 24.

Also in the fourth embodiment, the columnar body 30e having the width which narrows from the lid 24 toward the support substrate 10 may be used, as in the second embodiment. As in the third embodiment, the side surfaces of the recess 19 may be inclined so as to spread toward the support substrate 10. Further, also in the second to fourth embodiments, a plurality of columnar bodies may be provided as in the first and the second variations of the first embodiment.

Fifth Embodiment

Figure 21:
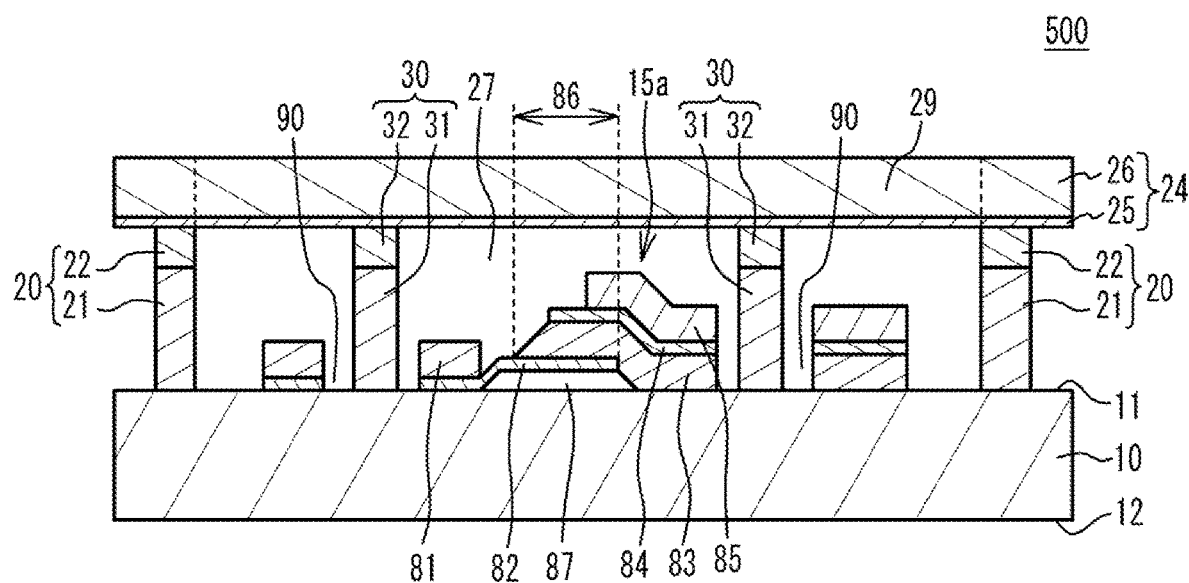
FIG. 21 is a cross-sectional view of an acoustic wave device according to a fifth embodiment.

FIG. 21 is a cross-sectional view of an acoustic wave device according to a fifth embodiment. As illustrated in FIG. 21, in an acoustic wave device 500 of the fifth embodiment, an acoustic wave element 15a is provided on the upper surface 11 of the support substrate 10. A piezoelectric layer 83 is provided on the upper surface 11 of the support substrate 10. A lower electrode 82 and an upper electrode 84 are provided so as to sandwich the piezoelectric layer 83. A space 87 is formed between the lower electrode 82 and the support substrate 10. A region where the lower electrode 82 and the upper electrode 84 face each other to sandwich at least a part of the piezoelectric layer 83 is a resonance region 86. In the resonance region 86, the lower electrode 82 and the upper electrode 84 excite acoustic waves of a thickness longitudinal vibration mode in the piezoelectric layer 83. Outside the resonance region 86, a lower wiring 81 is provided on the lower electrode 82 and an upper wiring 85 is provided on the upper electrode 84. Here, an insertion film for increasing a Q-value or for temperature compensation may be inserted in an outer peripheral region of the resonance region 86 of the piezoelectric layer 83.

The lower electrode 82 and the upper electrode 84 are metal films such as ruthenium films. The lower wiring 81 and the upper wiring 85 are metal films such as copper. The piezoelectric layer 83 is, for example, an aluminum nitride layer or a zinc oxide layer. An acoustic reflection film that reflects the acoustic waves may be provided in place of the space 87. The acoustic wave element 15a is manufactured by a generally known method.

The piezoelectric layer 83 and the like are not provided in a peripheral region of the support substrate 10, but the frame body 20 is provided on the support substrate 10 so as to surround the piezoelectric layer 83 and the like. The lid 24 is bonded onto the frame body 20. Thereby, the acoustic wave element 15a is sealed into the space 27.

A through hole 90 passing through the piezoelectric layer 83 and the like is formed. As in the through hole 40 of the first embodiment, the through hole 90 may be provided as an opening in a part of the piezoelectric layer 83 and the like, or may be provided so as to divide the piezoelectric layer 83 and the like into a plurality of pieces. In the through hole 90, the upper surface 11 of the support substrate 10 is exposed, for example. The columnar body 30 is provided between the support substrate 10 and the lid 24 in the through hole 90. The columnar body 30 is provided apart from the piezoelectric layer 83 and the like. One end of the columnar body 30 is in contact with the upper surface 11 of the support substrate 10, and the other end thereof is bonded to the lid 24.

As in the first and the second variations of the first embodiment, the columnar body 30 is provided at a position symmetrical with respect to the center of gravity of the inner region 29 of the lid 24. The columnar body 30 may be provided at the center of gravity of the inner region 29 of the lid 24, as in the first embodiment.

As in the first to the fourth embodiments, the functional element including electrodes provided on the surface of the piezoelectric layer may be an acoustic wave device including the interdigital electrodes 52 provided on the upper surface 14 of the piezoelectric layer 13, 13a, or 13b which is the single crystal lithium tantalate layer or the single crystal lithium niobate layer. As in the fifth embodiment, the functional element may be a piezoelectric thin film resonator including the lower electrode 82 and the upper electrode 84 provided on the upper surface and the lower surface of the piezoelectric layer 83. Further, the functional element may be other than the acoustic wave element, or may be a piezoelectric element such as a MEMS (Micro Electro Mechanical System) element. Also in the fifth embodiment, the columnar body 30e having the width which narrows from the lid 24 toward the support substrate 10 may be used, as in the second embodiment.

FIGS. 22A to 22K are plan views illustrating examples of the shape of the columnar body. In FIGS. 22A to 22K, cross hatching is added for clarity of the drawings. As illustrated in FIGS. 22A and 22B, the columnar body 30 may have a square shape or a rectangular shape in a plan view. As illustrated in FIGS. 22C and 22D, the corners of the square and the rectangle may be rounded. As illustrated in FIGS. 22E and 22F, the columnar body 30 may have a rectangular shape having each side protruding outward or may have a rectangular shape having each side recessing inward. As illustrated in FIGS. 22G to 22I, the columnar body 30 may have a circular shape, an elliptical shape, or a rhombic shape. As illustrated in FIG. 22J, the columnar body 30 may have a cross shape. As illustrated in FIG. 22K, the columnar body 30 may be hollow.

Figure 23A:
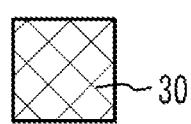
FIGS. 23A to 23G are side views illustrating examples of the shape of the columnar body.
Figure 23B:
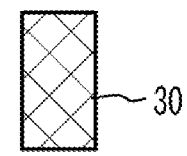
Figure 23C:
Figure 23D:
Figure 23E:
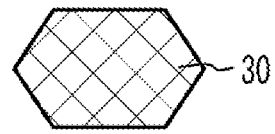
Figure 23F:
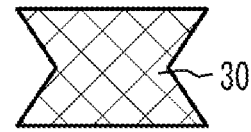
Figure 23G:
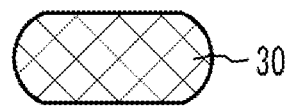

FIGS. 23A to 23G are side views illustrating examples of the shape of the columnar body. In FIGS. 23A to 23G, the cross hatching is added for clarity of the drawings. As illustrated in FIGS. 23A and 23B, the columnar body 30 may have a square shape or a rectangular shape in a side view. As illustrated in FIG. 23C, the columnar body 30 may have a trapezoidal shape in which the width decreases from the lid 24 toward the support substrate 10. As illustrated in FIG. 23D, the columnar body 30 may have a trapezoidal shape in which the width increases from the lid 24 toward the support substrate 10. As illustrated in FIGS. 23E and 23F, the columnar body 30 may have a shape in which two trapezoids are stacked. As illustrated in FIG. 23G, the columnar body 30 may have a rectangular shape having sides protruding outward.

Figure 24A:
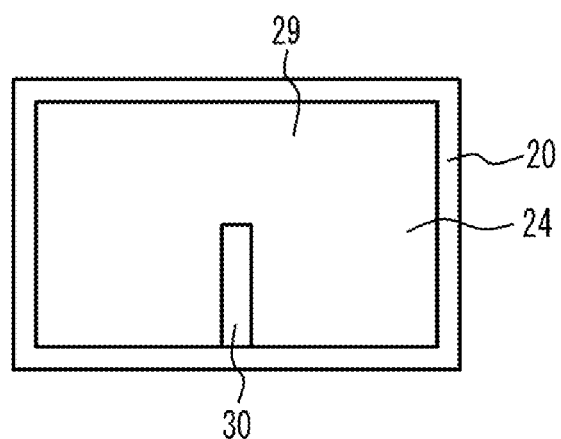
FIGS. 24A and 24B are plan views illustrating examples of the arrangement of the columnar body.
Figure 24B:
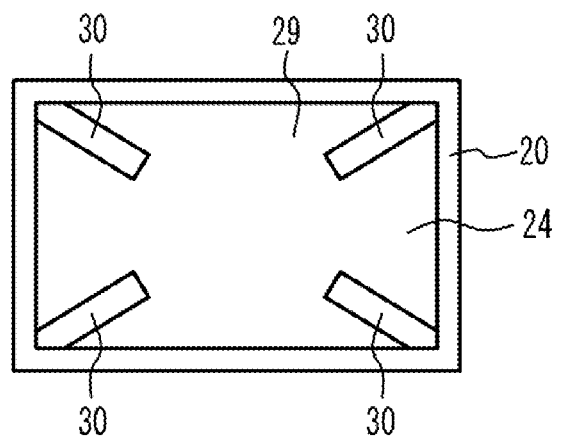

FIGS. 24A and 24B are plan views illustrating examples of the arrangement of the columnar body. As illustrated in FIG. 24A, the columnar body 30 may be arranged at a peripheral edge part of the inner region 29 of the lid 24. As illustrated in FIG. 24B, the columnar bodies 30 may be arranged at four corners of the inner region 29 of the lid 24.

Although the embodiments of the present invention have been described in detail, it is to be understood that the various change, substitutions, and alterations could be made hereto without departing from the spirit and scope of the invention.

What is claimed is:

1. An electronic device comprising:
a support substrate;
a piezoelectric layer that is provided on the support substrate;
a functional element including an electrode provided on a surface of the piezoelectric layer;
a metallic frame body that is provided on the support substrate so as to surround the piezoelectric layer and the functional element in a plan view;
a metallic lid that is provided on the frame body so as to form a space between the lid and the support substrate, and seals the functional element into the space; and
a columnar body that is provided between the support substrate and the lid in the space,
wherein one of end surfaces of the columnar body is in contact with the lid.

2. The electronic device according to claim 1, wherein the piezoelectric layer has a through hole passing therethrough, and
the columnar body is provided between the support substrate and the lid in the through hole.

3. The electronic device according to claim 2, wherein the height of the columnar body is larger than a distance from an upper surface of the support substrate to an upper surface of the electrode.

4. The electronic device according to claim 2, wherein the columnar body is provided apart from the piezoelectric layer.

5. The electronic device according to claim 2, wherein the other of the end surfaces of the columnar body is in contact with the support substrate.

6. An electronic device comprising:
a support substrate;
a piezoelectric layer that is provided on the support substrate;
a functional element including an electrode provided on a surface of the piezoelectric layer:
a metallic frame body that is provided on the support substrate so as to surround the piezoelectric layer and the functional element in a plan view;
a metallic lid that is provided on the frame body so as to form a space between the lid and the support substrate, and seals the functional element into the space: and
a columnar body that is provided between the support substrate and the lid in the space, wherein the piezoelectric layer has a recess in which the piezoelectric layer is present on the bottom surface, and
the columnar body is provided between the support substrate and the lid in the recess.

7. The electronic device according to claim 1, wherein the lid is connected to a ground,
the columnar body is made of metal, and has a width that narrows from the lid toward the support substrate.

8. The electronic device according to claim 1, wherein the columnar body is located at a center of gravity of an entirely of a region located inside the frame body of the lid, and is provided between the support substrate and the lid.

9. The electronic device according to claim 1, wherein the support substrate is one of a sapphire substrate, an alumina substrate, a spinel substrate, a quartz substrate, a crystal substrate and a silicon substrate,
the piezoelectric layer is one of a single crystal lithium tantalate layer and a single crystal lithium niobate layer, and
the functional element is an acoustic wave element including an interdigital electrode provided on the piezoelectric layer as the electrode.

10. The electronic device according to claim 1, wherein the functional element is a piezoelectric thin film resonator including a lower electrode and an upper electrode which sandwich the piezoelectric layer as the electrode.

11. The electronic device according to claim 1, wherein the other of the end surfaces of the columnar body is in contact with the support substrate.

* * * * *